US011747298B2

(12) United States Patent
Chang et al.

(10) Patent No.: US 11,747,298 B2
(45) Date of Patent: Sep. 5, 2023

(54) WAFER-LEVEL PACKAGING OF SOLID-STATE BIOSENSOR, MICROFLUIDICS, AND THROUGH-SILICON VIA

(71) Applicant: Taiwan Semiconductor Manufacturing Company, Ltd., Hsinchu (TW)

(72) Inventors: Allen Timothy Chang, Hsinchu (TW); Jui-Cheng Huang, Hsinchu (TW); Wen-Chuan Tai, Hsinchu (TW); Yu-Jie Huang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 146 days.

(21) Appl. No.: 17/095,151

(22) Filed: Nov. 11, 2020

(65) Prior Publication Data
US 2021/0239647 A1 Aug. 5, 2021

Related U.S. Application Data

(60) Provisional application No. 62/967,890, filed on Jan. 30, 2020.

(51) Int. Cl.
*G01N 27/414* (2006.01)
*H01L 23/48* (2006.01)
*H01L 23/522* (2006.01)

(52) U.S. Cl.
CPC ........ *G01N 27/4145* (2013.01); *H01L 23/481* (2013.01); *H01L 23/5226* (2013.01)

(58) Field of Classification Search
CPC ............ G01N 27/4145; G01N 27/414; G01N 33/54373; H01L 23/481; H01L 23/5226;
(Continued)

(56) References Cited

U.S. PATENT DOCUMENTS 9,080,969 B2  7/2015  Liu et al.
9,299,640 B2  2/2016  Lin
(Continued)

FOREIGN PATENT DOCUMENTS

KR   1020180018287 A   2/2018

OTHER PUBLICATIONS

Notice of Allowance for Korean Application No. 10-2021-0002574 dated Jul. 24, 2023.

*Primary Examiner* — Robert G Bachner
(74) *Attorney, Agent, or Firm* — Merchant & Gould P.C.

(57) ABSTRACT

A biosensor system package includes: a transistor structure in a semiconductor layer having a front side and a back side, the transistor structure comprising a channel region; a multi-layer interconnect (MLI) structure on the front side of the semiconductor layer, the transistor structure being electrically connected to the MLI structure; a carrier substrate on the MLI structure; a first through substrate via (TSV) structure extending though the carrier substrate and configured to provide an electrical connection between the MLI structure and a separate die; a buried oxide (BOX) layer on the back side of the semiconductor layer, wherein the buried oxide layer has an opening on the back side of the channel region, and an interface layer covers the back side over the channel region; and a microfluidic channel cap structure attached to the buried oxide layer.

20 Claims, 36 Drawing Sheets

(58) Field of Classification Search
CPC .............. H01L 23/49827; H01L 21/50; H01L 23/49838; H01L 23/5386; B01L 2300/023; B01L 2300/0636; B01L 2300/0645; B01L 3/502707; B01L 3/502715; B81B 7/0061; B81B 2201/058; B81B 2207/015; B81B 2207/096; B81B 7/0006; B81B 7/0032; B81B 7/02; B81B 2201/0214; B81B 2201/05; B81C 1/00246; B81C 1/00015; B81C 1/00119; B81C 1/00261; B81C 2203/01
See application file for complete search history.

(56) References Cited

U.S. PATENT DOCUMENTS

| | | |
|---|---|---|
| 10,131,540 B2 | 11/2018 | Yu et al. |
| 2010/0164117 A1* | 7/2010 | Chen .................. H01L 21/6835 257/774 |
| 2011/0244676 A1 | 10/2011 | Chen et al. |
| 2012/0211885 A1* | 8/2012 | Choi .................... H01L 25/105 257/737 |
| 2013/0200438 A1 | 8/2013 | Liu et al. |
| 2017/0158500 A1* | 6/2017 | Chang .................. H01L 23/528 |

\* cited by examiner

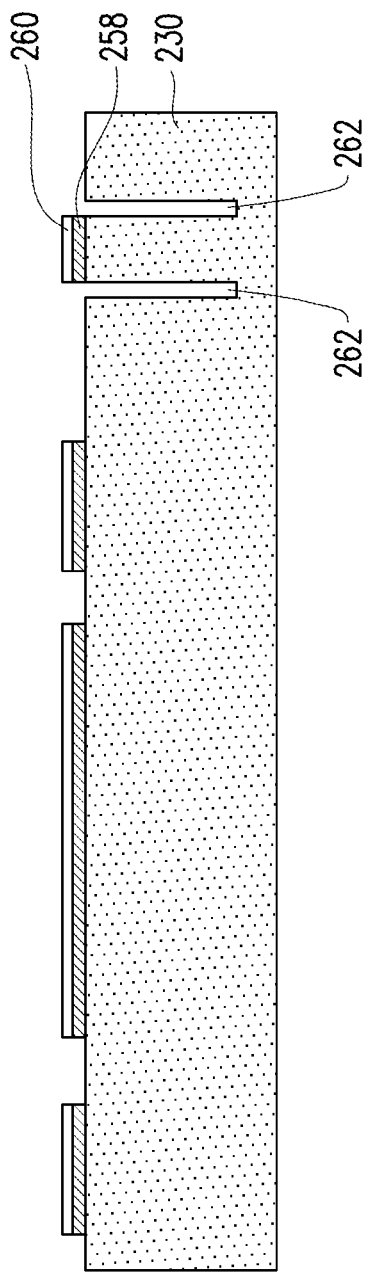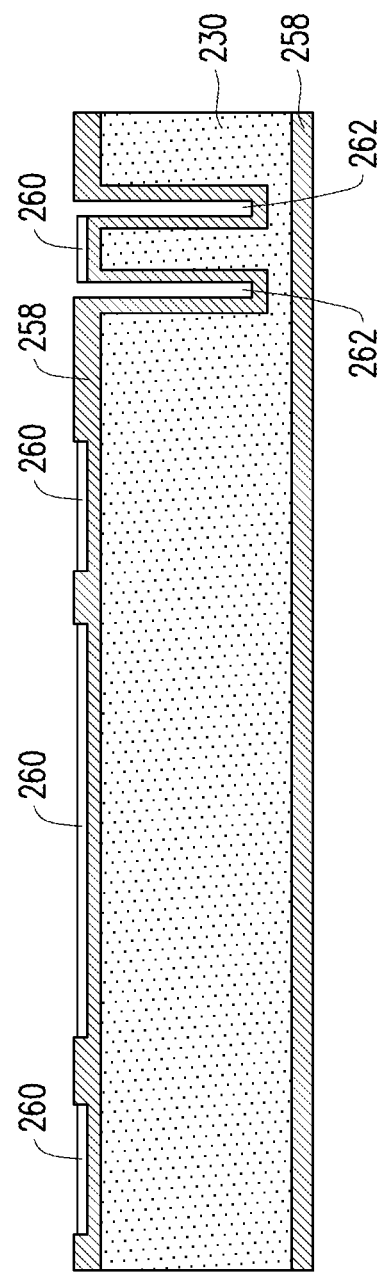

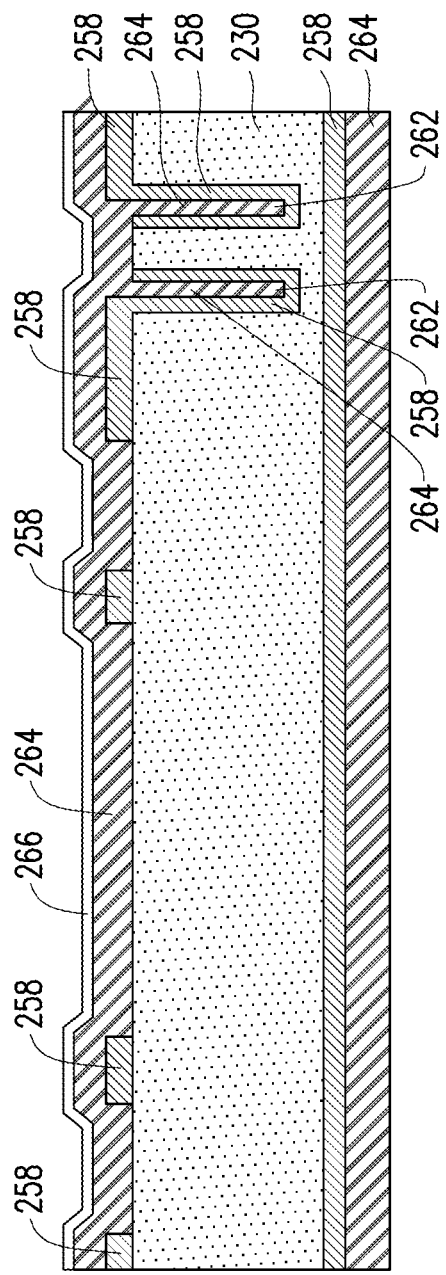
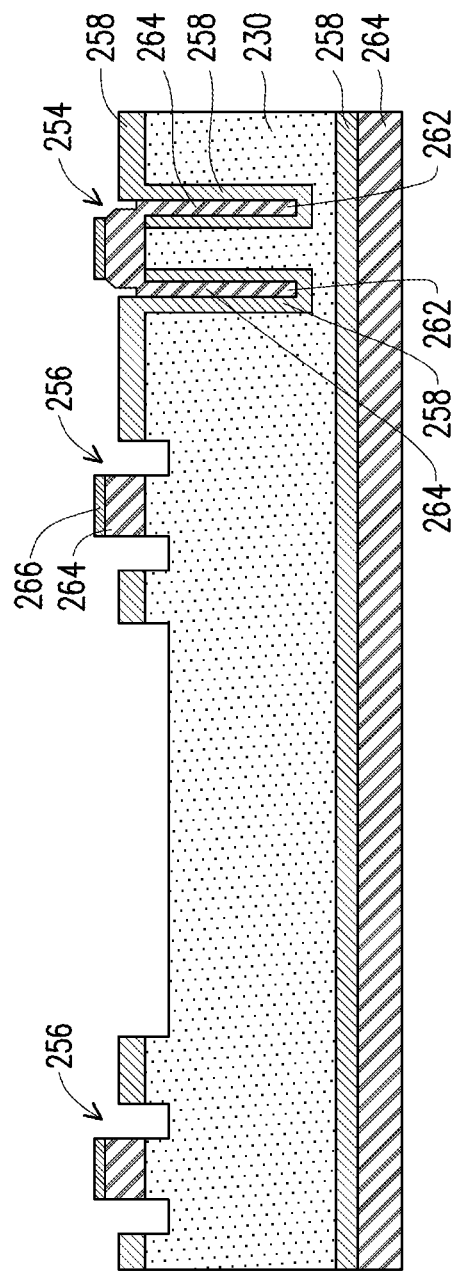
FIG. 39
FIG. 40

US 11,747,298 B2

WAFER-LEVEL PACKAGING OF SOLID-STATE BIOSENSOR, MICROFLUIDICS, AND THROUGH-SILICON VIA

PRIORITY CLAIM AND CROSS-REFERENCE

This application claims priority to U.S. Provisional Patent Application No. 62/967,890, filed Jan. 30, 2020, the disclosure of which is hereby incorporated by reference in its entirety.

BACKGROUND

Biosensors are devices for sensing and detecting biomolecules and operate on the basis of electronic, electrochemical, optical, and mechanical detection principles. Biosensors that include transistors are sensors that electrically sense charges, photons, and mechanical properties of bio-entities or biomolecules. The detection can be performed by detecting the bio-entities or biomolecules themselves, or through interaction and reaction between specified reactants and bio-entities/biomolecules. Such biosensors can be manufactured using semiconductor processes, can quickly convert electric signals, and can be easily applied to integrated circuits (ICs) and microelectromechanical systems (MEMS).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 33-47 are cross-sectional diagrams illustrating the biosensor system package constructed according to one or more steps of the method of FIG. 32A and FIG. 32B in accordance with some embodiments.

DETAILED DESCRIPTION

Figure 1B:
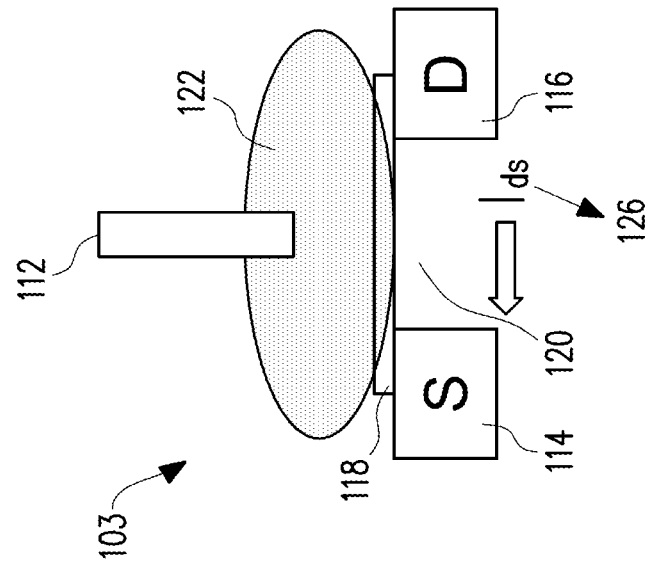
FIG. 1B is a schematic diagram of an example biosensor used in the biosensor system of FIG. 1A in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the term "bioFET" as used herein refers to a field-effect transistor (FET) that includes a layer of immobilized capture reagents that act as surface receptors to detect the presence of a target analyte of biological origin. A bioFET is a field-effect sensor with a semiconductor transducer, according to some embodiments. One advantage of bioFETs is the prospect of label-free operation. Specifically, bioFETs enable the avoidance of costly and time-consuming labeling operations such as the labeling of an analyte with, for instance, fluorescent or radioactive probes. The analytes for detection by a bioFET will normally be of biological origin, such as—without limitation—proteins, carbohydrates, lipids, tissue fragments, or portions thereof. A BioFET can be part of a broader genus of FET sensors that may also detect any chemical compound (known in the art as a "ChemFET") or any other element, including ions such as protons or metallic ions (known in the art as an "ISFET"). This disclosure applies to all types of FET-based sensors ("FET sensor").

"Capture reagent," as used herein, is a molecule or compound capable of binding the target analyte or target reagent, which can be directly or indirectly attached to a substantially solid material. The capture reagent can be a chemical, and specifically any substance for which there exists a naturally occurring target analyte (e.g., an antibody, polypeptide, DNA, RNA, cell, virus, etc.) or for which a target analyte can be prepared, and the capture reagent can bind to one or more target analytes in an assay.

"Target analyte," as used herein, is the substance to be detected in the test sample using the present disclosure. The target analyte can be a chemical, and specifically any substance for which there exists a naturally occurring capture reagent (e.g., an antibody, polypeptide, DNA, RNA, cell, virus, etc.) or for which a capture reagent can be prepared, and the target analyte can bind to one or more capture reagents in an assay. "Target analyte" also includes any antigenic substances, antibodies, or combinations thereof. The target analyte can include a protein, a peptide, an amino acid, a carbohydrate, a hormone, a steroid, a vitamin, a drug including those administered for therapeutic purposes as well as those administered for illicit purposes, a bacterium, a virus, and metabolites of or antibodies to any of the above substances.

"Test sample," as used herein, means the composition, solution, substance, gas, or liquid containing the target analyte to be detected and assayed using the present disclosure. The test sample can contain other components besides the target analyte, can have the physical attributes of a liquid, or a gas, and can be of any size or volume, including for example, a moving stream of liquid or gas. The test sample can contain any substances other than the target analyte as long as the other substances do not interfere with the binding of the target analyte with the capture reagent or the specific binding of the first binding member to the second binding member. Examples of test samples include, but are not limited to, naturally-occurring and non-naturally occurring samples or combinations thereof. Naturally-occurring test samples can be synthetic or synthesized. Naturally-occurring test samples include body or bodily fluids isolated from anywhere in or on the body of a subject, including, but not limited to, blood, plasma, serum, urine, saliva or sputum, spinal fluid, cerebrospinal fluid, pleural fluid, nipple aspirates, lymph fluid, fluid of the respiratory, intestinal, and genitourinary tracts, tear fluid, saliva, breast milk, fluid from the lymphatic system, semen, cerebrospinal fluid, intra-organ system fluid, ascitic fluid, tumor cyst fluid, amniotic fluid and combinations thereof, and environmental samples such as ground water or waste water, soil extracts, air, and pesticide residues or food-related samples.

Detected substances can include, for example, nucleic acids (including DNA and RNA), hormones, different pathogens (including a biological agent that causes disease or illness to its host, such as a virus (e.g., H7N9 or HIV), a protozoan (e.g., *Plasmodium*-causing malaria), or a bacteria (e.g., *E. coli* or *Mycobacterium tuberculosis*)), proteins, antibodies, various drugs or therapeutics or other chemical or biological substances, including hydrogen or other ions, non-ionic molecules or compounds, polysaccharides, small chemical compounds such as chemical combinatorial library members, and the like. Detected or determined parameters may include, but are not limited to, pH changes, lactose changes, changing concentration, particles per unit time where a fluid flows over the device for a period of time to detect particles (e.g., particles that are sparse), and other parameters.

As used herein, the term "immobilized," when used with respect to, for example, a capture reagent, includes substantially attaching the capture reagent at a molecular level to a surface. For example, a capture reagent may be immobilized to a surface of the substrate material using adsorption techniques including non-covalent interactions (e.g., electrostatic forces, van der Waals, and dehydration of hydrophobic interfaces) and covalent binding techniques where functional groups or linkers facilitate attaching the capture reagent to the surface. Immobilizing a capture reagent to a surface of a substrate material may be based on the properties of the substrate surface, the medium carrying the capture reagent, and the properties of the capture reagent. In some cases, a substrate surface may be first modified to have functional groups bound to the surface. The functional groups may then bind to biomolecules or biological or chemical substances to immobilize them thereon.

Data collected by biosensors needs to be sent to memory devices such as dynamic random-access memories (DRAMs) on a separate chip (i.e., a die) for data processing. The biosensor chip and the DRAM chip are on different locations on a printed circuit board (PCB). For higher resolution array (e.g., 1024 by 1024) of biosensors, the routing between the biosensor chip and DRAM limits data transfer rate and bandwidth as well as increases power consumption and data distortion. Increasing the bandwidth of the data signal path between the biosensor and the DRAM requires reducing the resistance, capacitance, inductance, noise, and distortion of the signal path. It is therefore desirable to reduce the physical distance of the signal path between the biosensor and the DRAM to reduce power and bandwidth issues associated with the resistance, capacitance, and inductance of the path. However, there are physical limits to signal path reduction if the biosensor chip and the DRAM are located separately on a PCB board.

In accordance with some embodiments, a wafer level packaging is provided to integrate a biosensor (or a biosensor array) with a microfluidic channel cap structure. The microfluidic channel cap structure is fabricated using a complementary metal-oxide-semiconductor (CMOS) compatible process flow. This is a scalable and cost-effective form of manufacturing compared with die-level packaging. Through the use of a through silicon via (TSV) interfacing between chips/dies, the signal path between the biosensor array, the DRAM, and the processing chips are minimized to the fullest extent. This reduces the resistance, capacitance, and inductance in the conductive paths between the chips/dies, which in turn reduces power consumption, delay, noise and distortion as well as increases bandwidth. This allows data from higher resolution biosensor arrays to be analyzed much faster. In one embodiment, the biosensor system package can be connected to one separate chip at the front side (using a first TSV structure through the carrier substrate). In another embodiment, the biosensor system package can be connected to another separate chip at the back side (using a second TSV structure through the cap structure substrate). In yet another embodiment, the biosensor system package can be connected to both one separate chip at the front side (using a first TSV structure through the carrier substrate) and another separate chip at the back side (using a second TSV structure through the cap structure substrate).

Embodiments of the disclosure may increase the integration and miniaturization of the biosensor analyzer system. Embodiments of the disclosure may also reduce space needed by PCB by directly packaging together the biosensor (or biosensor array) with supporting electronics. Additionally, the microfluidic channel can be directly fabricated with the biosensor (or biosensor array) together in a compatible process flow.

Figure 1A:
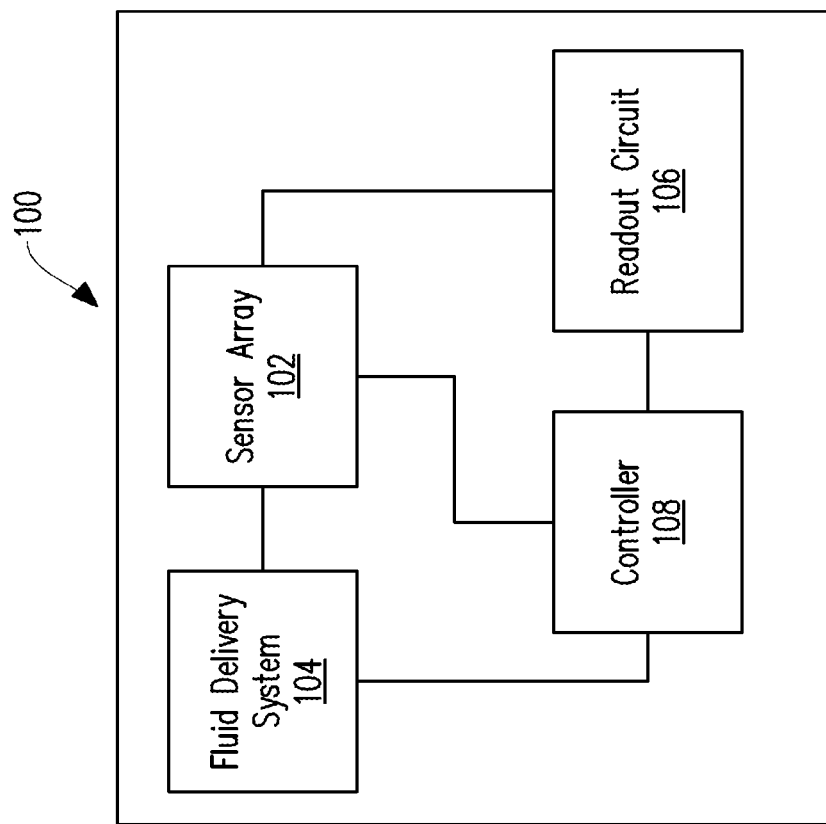
FIG. 1A is a block diagram of an example biosensor system in accordance with some embodiments.

FIG. 1A is a block diagram of an example biosensor system 100 in accordance with some embodiments. FIG. 1B is a schematic diagram of an example biosensor 103 used in the biosensor system 100 of FIG. 1A in accordance with some embodiments. As shown in FIG. 1A, the example biosensor system 100 may include, among other things, a sensor array 102, a fluid delivery system 104, a readout circuit 106 and a controller 108.

The sensor array 102 may have at least one sensing element for detecting a biological or chemical analyte. The sensor array 102 may include an array of biosensors (e.g., a biosensor 103 shown in FIG. 1B), where one or more of the biosensors in the array are functionalized to detect a particular target analyte. Different ones of the biosensors may be functionalized using different capture reagents for detecting different target analytes. The biosensors may be arranged in a plurality of rows and columns, forming a 2-dimensional array of biosensors. In some embodiments, each row of biosensors is functionalized using a different capture reagent. In some embodiments, each column of biosensors is functionalized using a different capture reagent. In some embodiments, a certain range of rows and columns of biosensors are functionalized using a different capture reagent. Further details regarding an example biosensor 103 is provided below with reference to FIG. 1B.

The fluid delivery system 104 may deliver one or more fluid samples to the sensor array 102. The fluid delivery system 104 may be a microfluidic well positioned above the sensor array 102 to contain a fluid over the sensor array 102. The fluid delivery system 104 may also include microfluidic channels for delivering various fluids to the sensor array 102. The fluid delivery system 104 may include any number of valves, pumps, chambers, channels designed to deliver fluid to the sensor array 102.

The readout circuit 106 is provided to measure signals from the sensors in the sensor array 102 and to generate a quantifiable sensor signal indicative of the amount of a certain analyte that is present in a target solution, according to some embodiments.

The controller 108 may send and receive electrical signals to both the sensor array 102 and the readout circuit 106 to perform bio- or chemical-sensing measurements. The controller 108 may also send electrical signals to the fluid delivery system 104 to, for example, actuate one or more valves, pumps, or motors. The controller 108 may include one or more processing devices, such as a microprocessor, and may be programmable to control the operation of the readout circuit 106, the sensor array 102 and/or the fluid delivery system 104.

As shown in FIG. 1B, the example biosensor 103 may include, among other things, a fluid gate 112, a source region 114, a drain region 116, a sensing film 118, a channel region 120. The fluid delivery system 104 applies a fluid 122 over the sensing film 118. The fluid 122 may contain analyte not shown. The sensing film 118 may be an electrically and chemically insulating layer that separates the fluid 122 from the channel region 120. The sensing film 118 may include, among other things, a layer of a capture reagent. The capture reagent is specific to an analyte and capable of binding the target analyte or target reagent. Upon binding of the analyte, changes in the electrostatic potential at the surface of the sensing film 118 occur, which in turn results in an electrostatic gating effect of the biosensor 103, and a measurable change in a current Ids 126 between the source and drain electrodes. A voltage applied to the fluid gate 112 may also change the Ids 126.

Wafer-level packaging is used to integrate the biosensor 103 or the biosensor array 102 with microfluidic channel to form a package. Additionally, chips (i.e., dies) are connected to either a top part or a bottom part of the package through a through silicon via (TSV). Further details regarding the wafer-level packaging and TSV connection are provided below.

Figure 2:
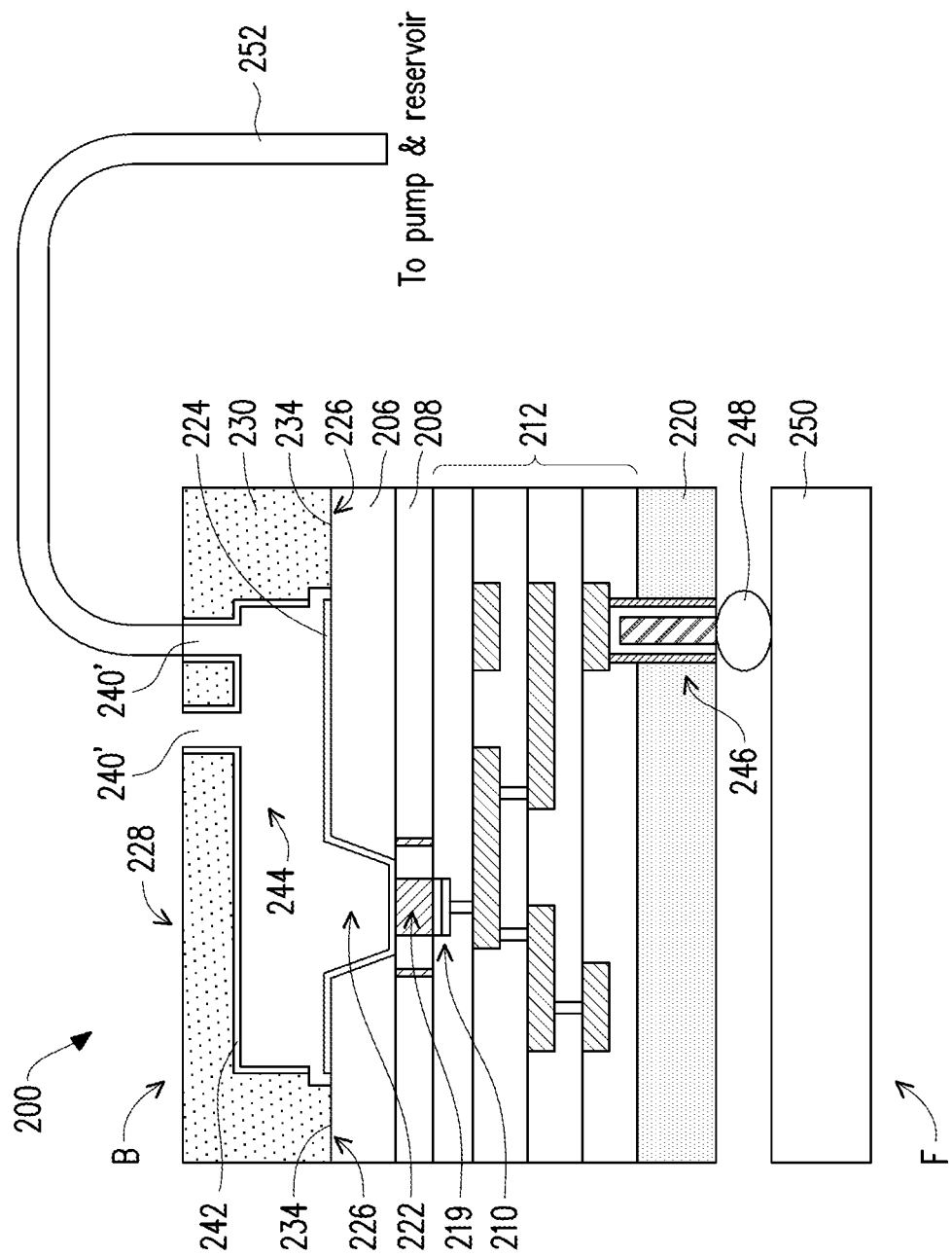
FIG. 2 is a cross-sectional diagram illustrating a biosensor system package in accordance with some embodiments.
Figure 3A:
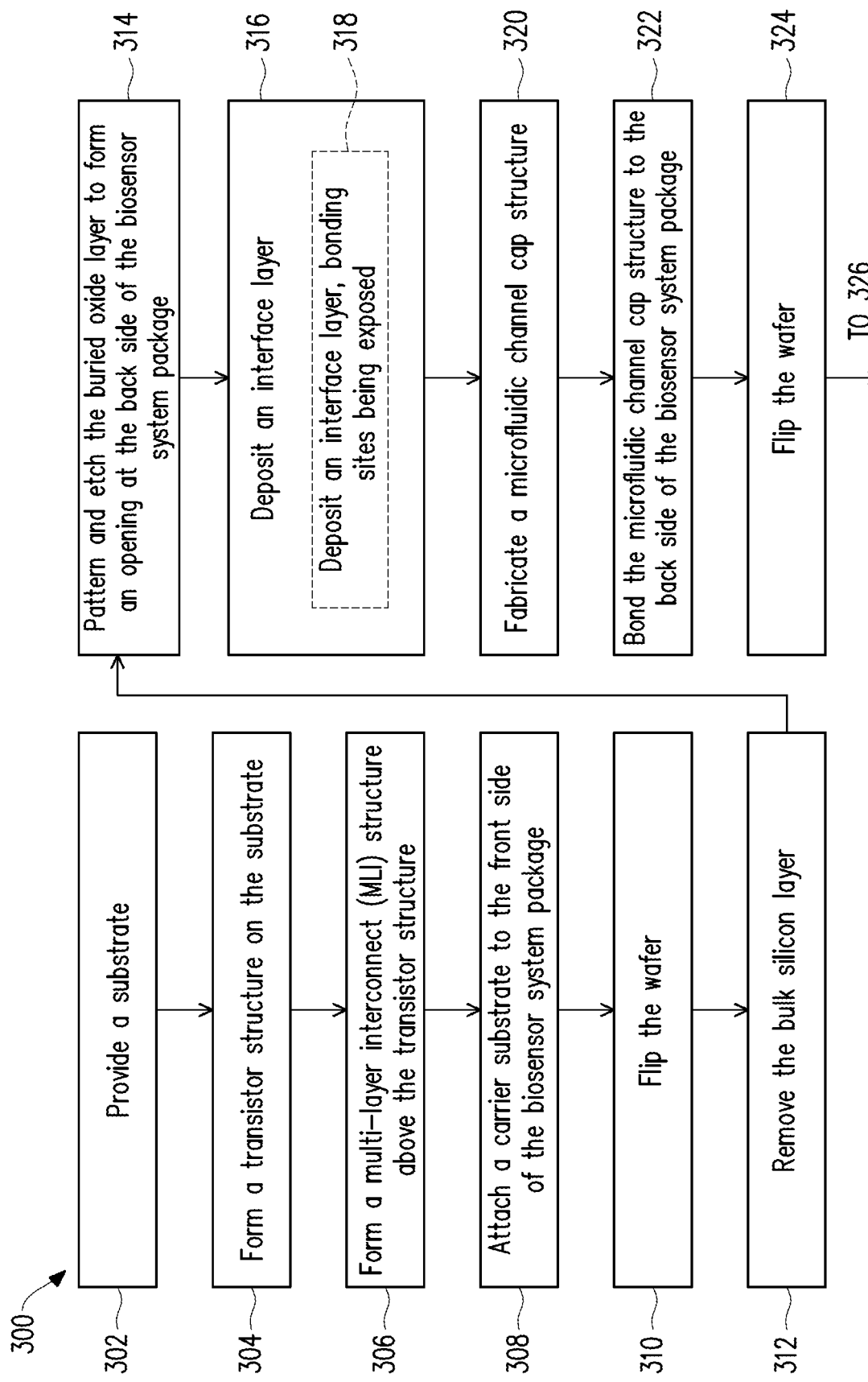
FIG. 3A and FIG. 3B are flowchart diagrams illustrating a method of fabricating the biosensor system package of FIG. 2 in accordance with some embodiments.
Figure 3B:
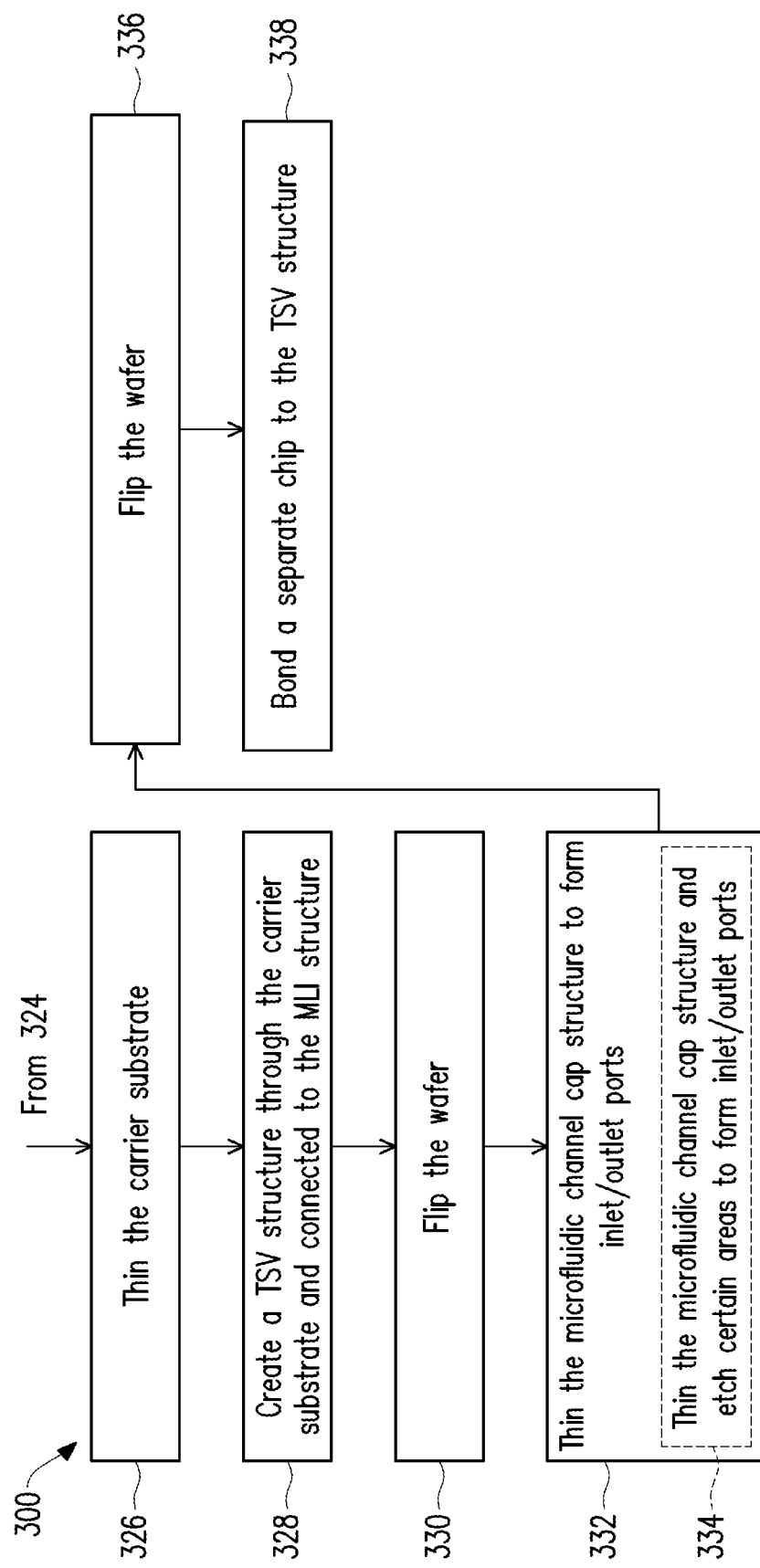

FIG. 2 is a cross-sectional diagram illustrating a biosensor system package 200 in accordance with some embodiments. FIG. 3A and FIG. 3B are flowchart diagrams illustrating a method 300 of fabricating the biosensor system package of FIG. 2 in accordance with some embodiments. FIGS. 4-24 are cross-sectional diagrams illustrating the biosensor system package constructed according to one or more steps of the method of FIG. 3A and FIG. 3B in accordance with some embodiments.

As shown in FIG. 2, the biosensor system package 200 has a front side (F) and a back side (B). In the example shown in FIG. 2, the biosensor system package 200 includes, among other things, a buried oxide (BOX) layer 206, and a semiconductor layer 208, a transistor structure (i.e., a FET) 210, a multilevel-interconnect (MLI) structure 212, a carrier substrate 220, a TSV structure 246, a solder bump 248, a separate chip/die (e.g., a RAM and data processing chip) 250, a trench 222, an interface layer (e.g., a high-k material layer) 224, and a microfluidic channel cap structure 228. The separate chip 250 is connected to the TSV structure 246 using solder bump bonding at the front side (F). The microfluidic channel cap structure 228 is attached to the back side (B). The microfluidic channel cap structure 228 includes, among other things, a cap structure 230, a chamber 244, inlet/outlet ports 240', and optionally a high-k oxide material layer 242. The chamber 244 can accommodate fluid samples to be tested. The inlet/outlet ports 240' can be connected to pumps and/or reservoirs through tube(s) 252 for the inflow and outflow of the fluid samples. Details of the components of the biosensor system package 200 will be described below with reference to FIGS. 3A-3C and 4-24.

Figure 3C:
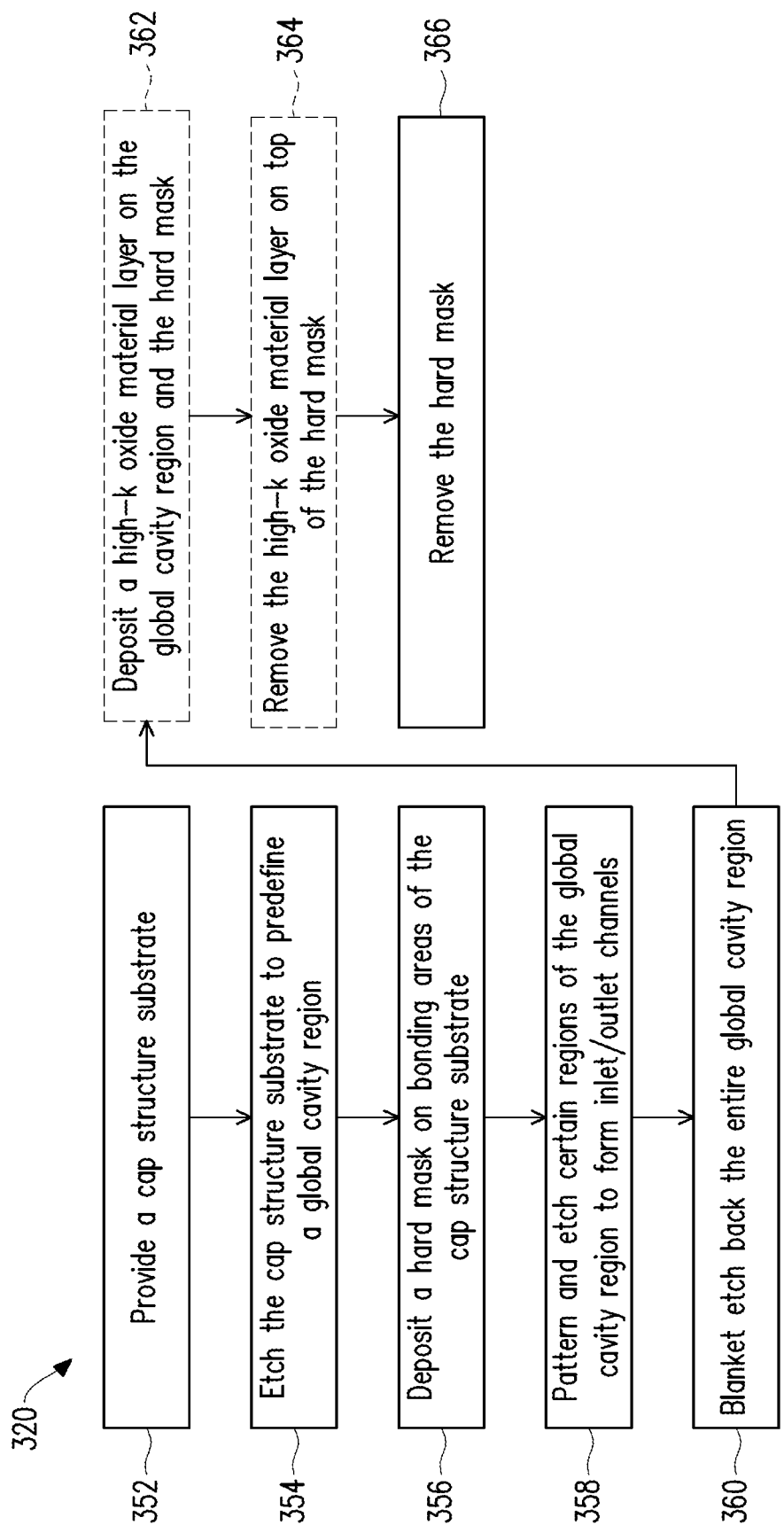
FIG. 3C is a flowchart diagram illustrating a step of the method of FIG. 3A and FIG. 3B in accordance with some embodiments.

As shown in FIG. 3A and FIG. 3B, the method 300 is used to fabricate a biosensor system package. FIG. 3C is a flowchart diagram illustrating the step 320 of the method 300 in accordance with some embodiments. It should be noted that additional steps can be provided before, during, and after the method 300, and some of the steps described below can be replaced or eliminated, for additional embodiments of the method. Further, it should be noted that the method 300 is a CMOS-compatible process flow.

The method 300 begins at step 302 where a substrate is provided. The substrate may be a semiconductor substrate (e.g., wafer). The semiconductor substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment shown in FIGS. 3A-3B and FIGS. 4-38, the substrate is a semiconductor on insulator (SOI) substrate 202. The SOI substrate 202 shown in FIG. 4 includes a bulk silicon layer 204, a buried oxide (BOX) layer 206, and a semiconductor layer 208 (i.e., an active layer 208). The buried oxide layer 206 may be formed by a process such as separation by implanted oxygen (SIMOX), and/or other suitable processes. The semiconductor layer 208 may include doped regions, such as p-wells and n-wells.

The method then proceeds to step 304 where a transistor structure is formed on the substrate. The transistor structure (i.e., the FET) may include a gate structure, a source region, a drain region, and a channel region interposing the source and drain regions. As shown in the example in FIG. 4, the source, drain, and/or channel region of the FET 210 may be formed on an active region in the semiconductor layer 208. The FET 210 may be an n-type FET (nFET) or a p-type FET (pFET). For example, the source/drain regions may comprise n-type dopants or p-type dopants depending on the FET configuration. The gate structure may include a gate dielectric layer, a gate electrode layer, and/or other suitable layers. In an embodiment, the gate electrode is polysilicon. Other exemplary gate electrodes include metal gate electrodes including material such as, Cu, W, Ti, Ta, Cr, Pt, Ag, Au; suitable metallic compounds like TiN, TaN, NiSi, CoSi; combinations thereof; and/or other suitable conductive materials. In an embodiment, the gate dielectric is silicon oxide. Other exemplary gate dielectrics include silicon nitride, silicon oxynitride, a dielectric with a high dielectric constant (high-k), and/or combinations thereof. Examples of high-k materials include hafnium silicate, hafnium oxide, zirconium oxide, aluminum oxide, tantalum pentoxide, hafnium dioxide-alumina ($HfO_2$—$Al_2O_3$) alloy, or combinations thereof. The FET 210 may be formed using typical CMOS processes such as, photolithography; ion implantation; diffusion; deposition including physical vapor deposition (PVD), metal evaporation or sputtering, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), spin on coating; etching including wet etching, dry etching, and plasma etching; and/or other suitable CMOS processes.

The method 300 then proceeds to step 306 where a multi-layer interconnect (MLI) structure is formed above the transistor structure. The MLI structure may include conductive lines, conductive vertical interconnect accesses (vias), and/or interposing dielectric layers (e.g., interlayer dielectric (ILD) layers). The MLI structure may provide physical and electrical connection to the transistor (i.e., the FET), described above with reference to step 304. The conductive lines may comprise copper, aluminum, tungsten, tantalum, titanium, nickel, cobalt, metal silicide, metal nitride, poly silicon, combinations thereof, and/or other materials possibly including one or more layers or linings. The interposing dielectric layers (e.g., ILD layers) may comprise silicon dioxide, fluorinated silicon glass (FGS), SILK (a product of Dow Chemical of Michigan), BLACK DIAMOND (a product of Applied Materials of Santa Clara, Calif.), and/or other suitable insulating materials. The MLI structure may be formed by suitable processes typical in CMOS fabrication such as CVD, PVD, ALD, plating, spin-on coating, and/or other processes.

Figure 4:
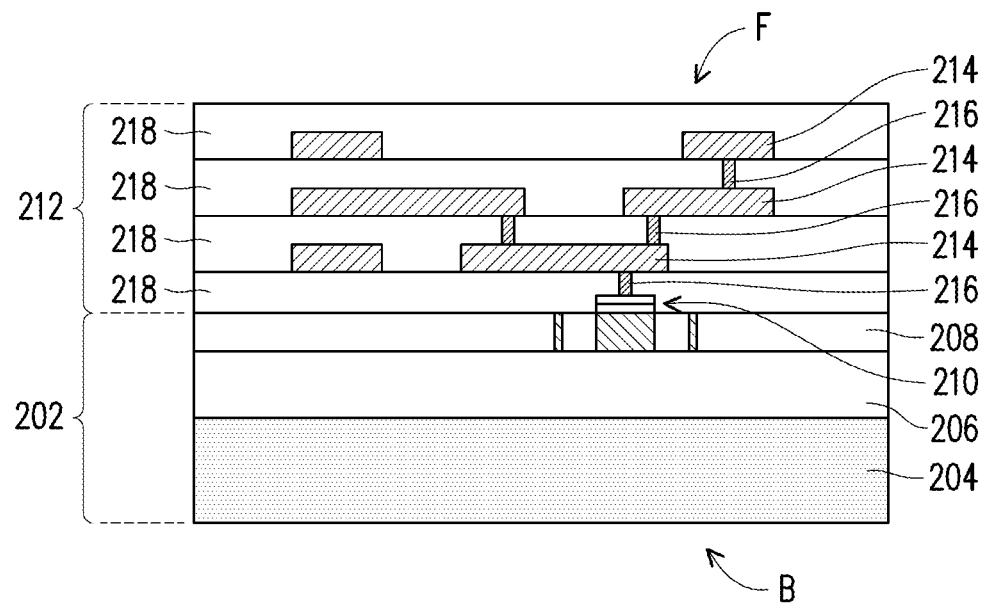
FIGS. 4-24 are cross-sectional diagrams illustrating the biosensor system package constructed according to one or more steps of the method of FIG. 3A and FIG. 3B in accordance with some embodiments.
Figure 5:
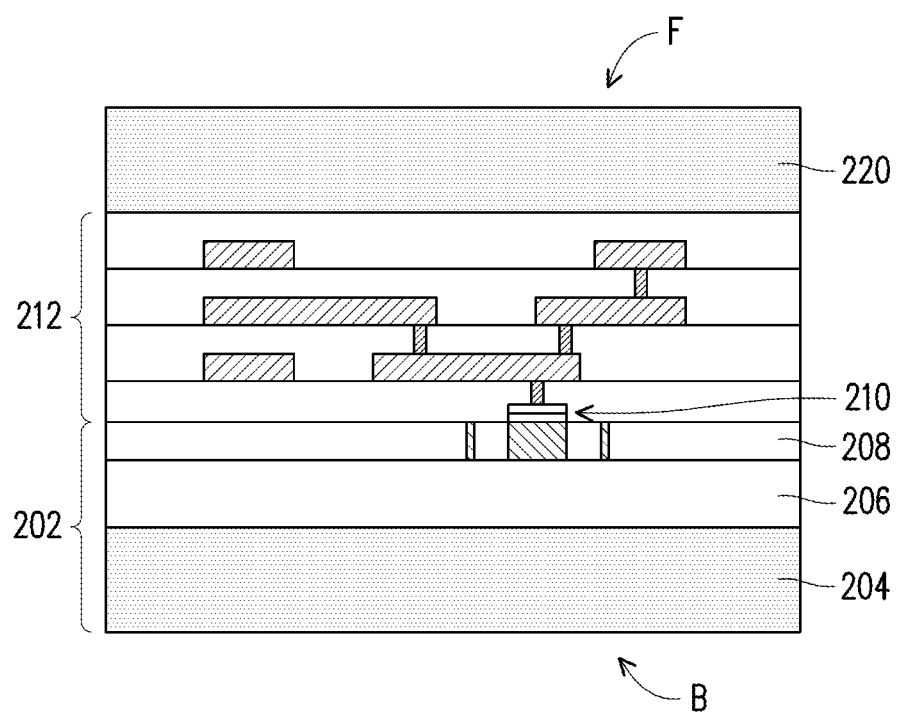

As shown in the example in FIG. 4, an MLI structure 212 is disposed on the substrate 202 and above the FET 210. The MLI structure 212 includes a plurality of conductive lines 214 connected by conductive vias or plugs 216. In one embodiment, the conductive lines 214 include aluminum and/or copper. In one embodiment, the vias or plugs 216 include tungsten. In another embodiment, the vias or plugs 216 include copper. In one embodiment, the interposing dielectric layers 218 are disposed on the substrate 202 including interposing the conductive features of the MLI structure 212. The interposing dielectric layers 218 may be ILD layers. In another embodiment, the dielectric layer 218 is a single ILD layer. In one embodiment, each of the interposing dielectric layer 218 includes silicon oxide. The MLI structure 212 may provide electrical connection to the gate and/or the source/drain of the FET 210. As shown in the example in FIG. 4, the MLI structure 212 is at the front side (F) while the substrate 202 is at the back side (B).

The method 300 then proceeds to step 308 where a carrier substrate is attached to the front side (F). In other words, the carrier substrate is attached to the MLI structure. The carrier substrate may protect the front side (F) during subsequent steps. In one embodiment, the carrier substrate is bonded to the MLI structure. In another embodiment, the carrier substrate is bonded to a passivation layer formed on the MLI structure. The carrier substrate may be attached using fusion, diffusion, eutectic, and/or other suitable bonding methods. Exemplary compositions for the carrier substrate include silicon, glass, and quartz. It should be noted that other compositions are possible and within the scope of the present disclosure. As shown in the example in FIG. 5, a carrier substrate 220 is attached to the MLI structure 212. In some embodiments, the carrier substrate 220 may include functionalities such as, interconnect features, wafer bonding sites, defined cavities, and/or other suitable features.

Figure 6:
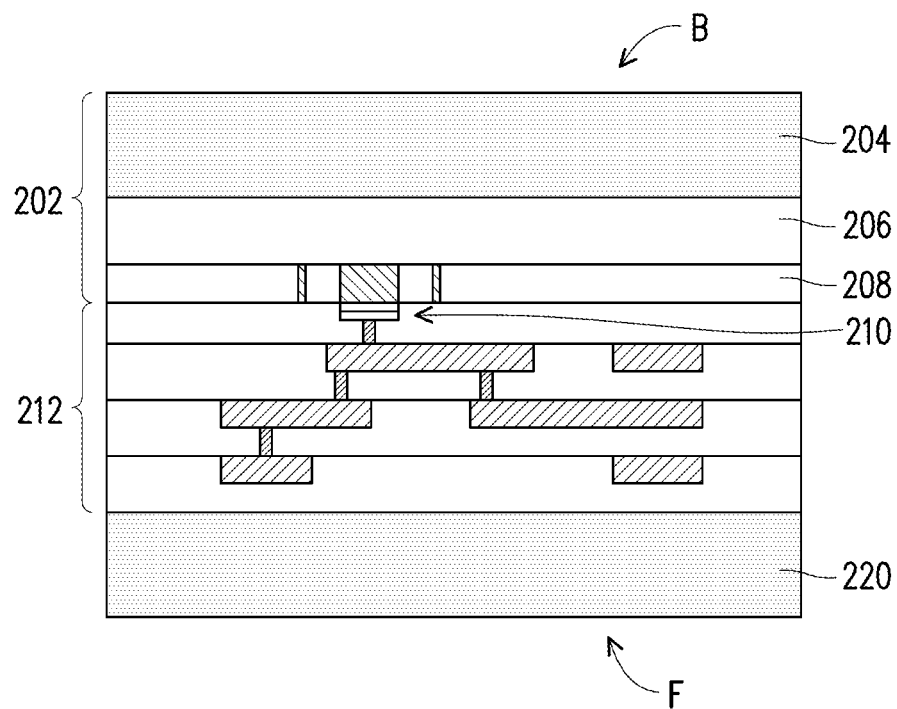
Figure 7:
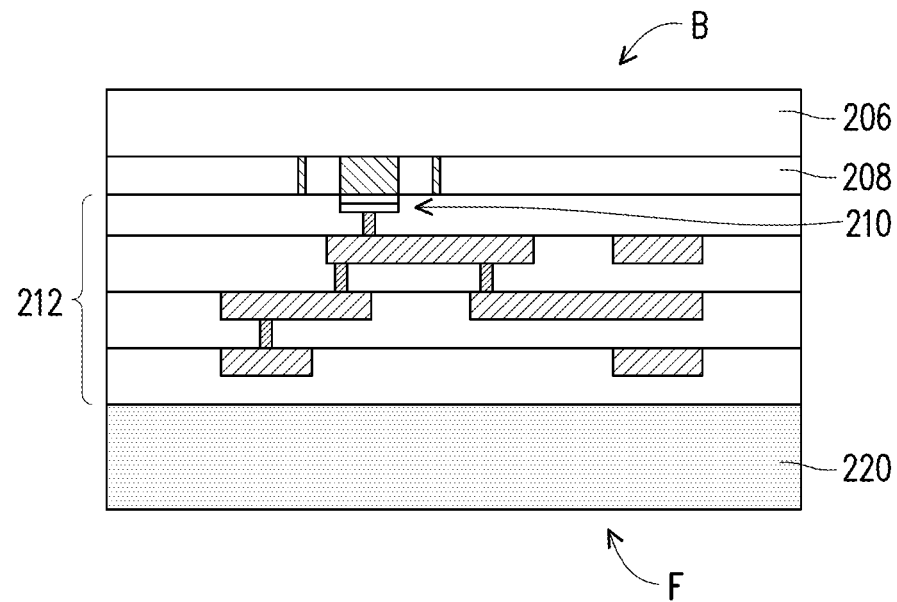

The method 300 then proceeds to step 310 where the wafer is flipped. As shown in FIG. 6, the back side (B) is on the top. In other words, the bulk silicon layer 204 is on the top. The method 300 then proceeds to step 312 where the bulk silicon layer 204 is removed. The removal may be accomplished by mechanical or chemical means. For example, a mechanical means includes polishing or grinding, such as chemical mechanical polishing (CMP). A chemical means includes wet etch, such as HF/nitric/acetic acid (HNA) or tetramethylammonium hydroxide (TMAH) or dry etch including plasma and non-plasma etch. As shown in the example in FIG. 7, the bulk silicon layer 204 in FIG. 6 is removed. The buried oxide layer 206 is on the top at the back side (B).

The method 300 then proceeds to step 314 where the buried oxide layer is patterned to form an opening at the back side (B). A photoresist pattern is formed on the buried oxide layer. In some embodiments, the photoresist pattern protects some of the buried oxide layer from a subsequent non-plasma etch to expose the backside (B) of the biosensor system package 200. Specifically, the photoresist pattern protects some of the buried oxide layer from the subsequent non-plasma etch to expose the active region of the transistor structure formed at step 304. The non-plasma etch may be a wet etch or a dry etch that does not involve plasma. In some embodiments, a two-step etch process may be employed to form the opening at the back side (B). The first etching step contains plasma and the second etching step is a non-plasma etch. As shown in the example in FIG. 8, the non-plasma etch forms a trench 222 having a bottom exposing the channel region 219 of the FET 210. A non-plasma etch is used to avoid plasma-induced damage (PID) at the exposed surface of the channel region 219. In an non-limiting example, the height of the trench 222 may range between 0.3 μm to 1 μm, while the width of the trench 222 may range between 0.5 μm to 200 μm (in some extreme cases). In some embodiments, the sidewall profile of the trench 222 is substantially straight. After the non-plasma etch, the photoresist pattern is removed. A PID-less photoresist removal process such as stripping and ozone ashing may be used. Because the exposed surface of the trench 222 and the exposed surface of the channel region of the FET 210 are susceptible to plasma-induced damage (PID), some plasma ashing processes may not be used to remove the photoresist pattern.

The method 300 then proceeds to step 316. At step 316, an interface layer is deposited. In one embodiment, the interface layer is a high-k material layer. The interface layer is compatible (e.g., friendly) for biomolecules or bio-entities binding. For example, the interface layer may include a capture reagent layer, which is a layer of capture reagent capable of binding a target analyte in the fluid samples. In some embodiments, the interface layer includes a plurality of layers. For instance, the interface layer may include a dielectric material (e.g., a high-k material), a conductive material, and/or other suitable material for holding a receptor. Exemplary interface materials include high-k dielectric films, metals, metal oxides, dielectrics, and/or other suitable materials. As a further example, exemplary interface layer materials include $HfO_2$, $Ta_2O_5$, Pt, Au, W, Ti, Al, Cu, oxides of such metals, $SiO_2$, $Si_3N_4$, $Al_2O_3$, $TiO_2$, TiN, $ZrO_2$, SnO, $SnO_2$; and/or other suitable materials. The interface layer may be formed using CMOS processes such as, for example, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), or atomic layer CVD (ALCVD). A photoresist pattern is formed over the interface layer to protect a portion of the interface layer. The portion over the channel region of the FET is protected. Unprotected portions of the interface layer is removed in a subsequent etch process. The etch process may involve any known etch process including plasma etch, since the portion susceptible to PID is protected. The interface layer completely covers the channel region and may partially cover the source region and drain region. The partial coverage of the source and drain region may be adjusted based on the FET design and area requirements for the interface layer. In some embodiments, the interface layer may not be patterned and etched and remains over the respective surfaces of the FET.

Figure 8:
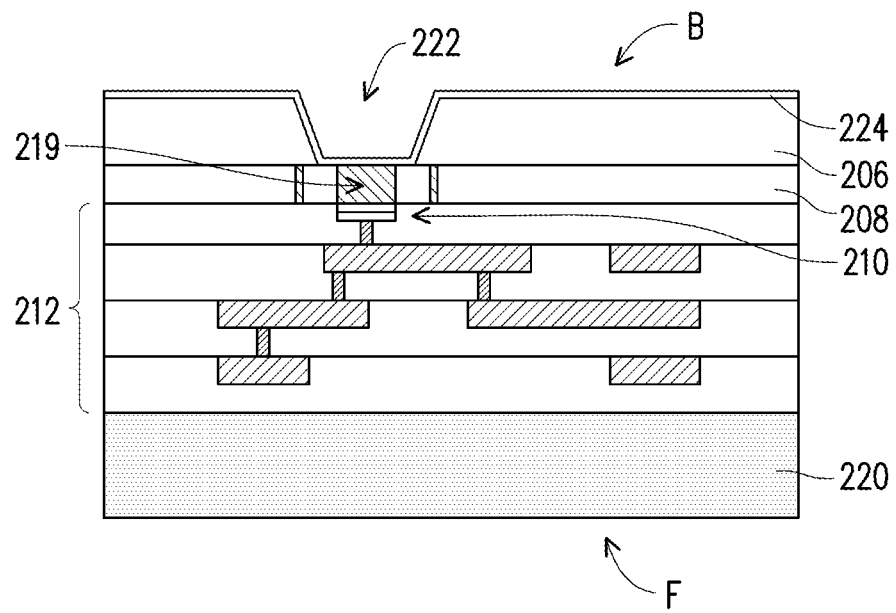

As shown in the example in FIG. 8, an interface layer 224 (e.g., a high-k material layer) is formed on the exposed surface of the trench 222 and the exposed surface of the active region of the FET 210. Additionally, the interface layer 224 is deposited over the entire surface of the buried oxide layer 206.

Alternatively at step 318, an interface layer is deposited while some bonding sites are exposed. The bonding sites are used for bonding a microfluidic channel cap structure to the back side (B), which will be described in detail below at step 322. It should be noted that whether bonding sites are required depends on specific bonding requirements. Similar to step 316, the interface layer may be formed using CMOS processes such as, for example, PVD (sputtering), CVD, PECVD, APCVD, LPCVD, HDPCVD, or ALCVD. A photoresist pattern is formed over the interface layer to protect a portion of the interface layer, and the bonding sites are not protected. Unprotected portions of the interface layer is removed in a subsequent etch process. The etch process may involve any known etch process including plasma etch, since the portion susceptible to PID is protected. After etching, the photoresist is removed in a PID-free photoresist removal process.

Figure 9:
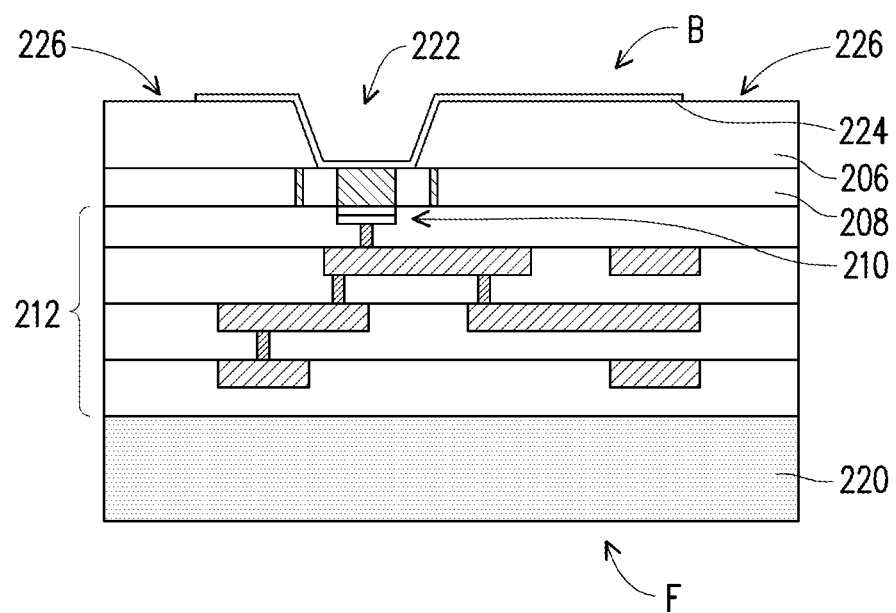
Figure 10:
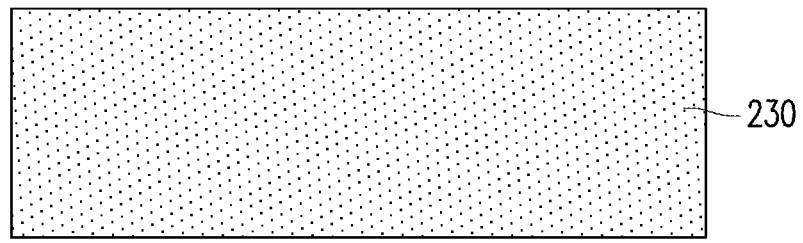
Figure 11:
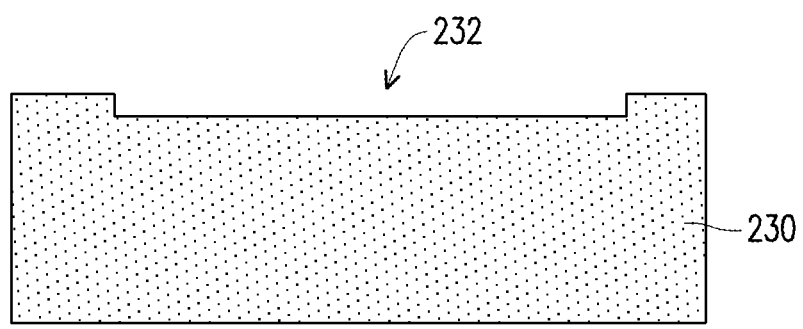
Figure 12:
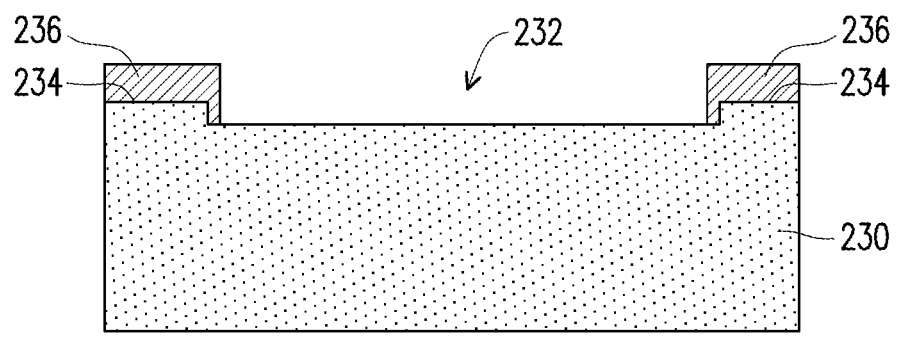
Figure 13:
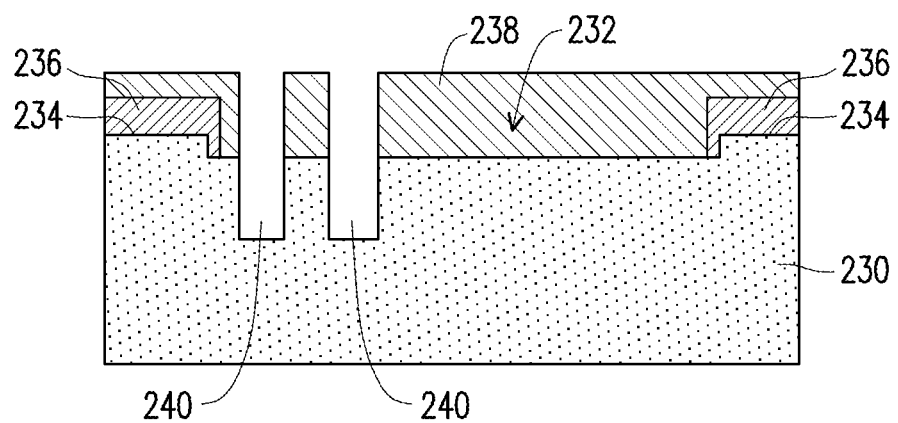
Figure 14:
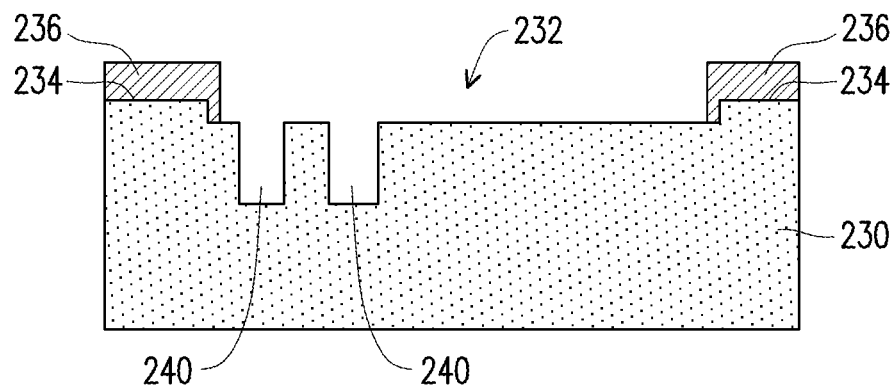
Figure 15:
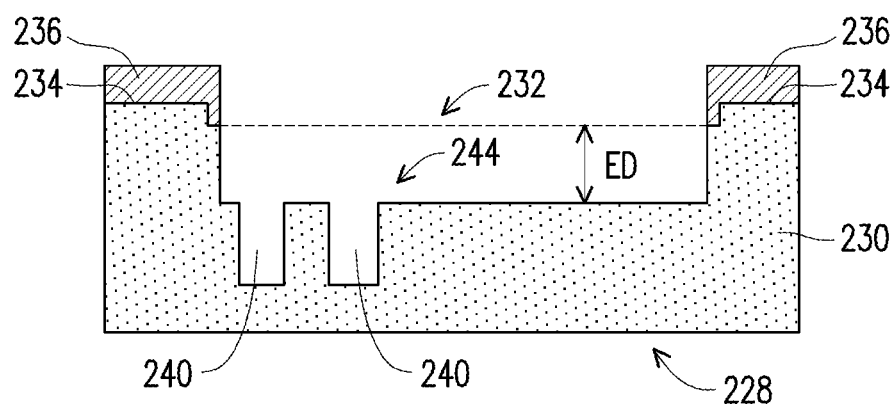
Figure 16:
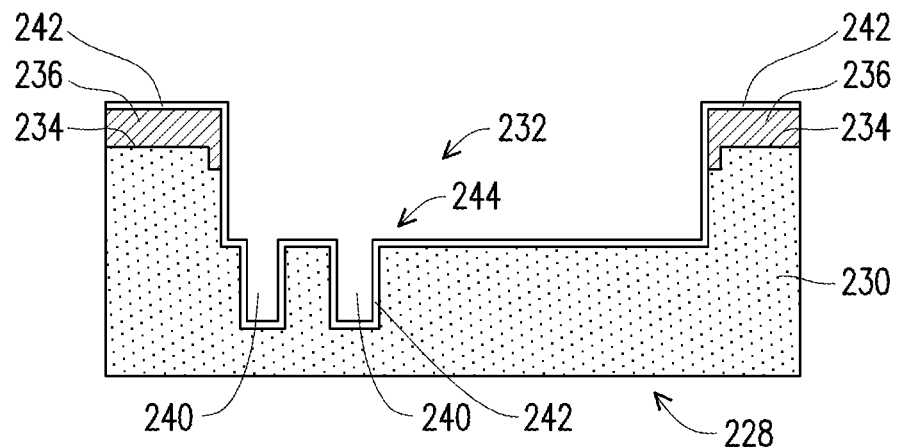
Figure 17:
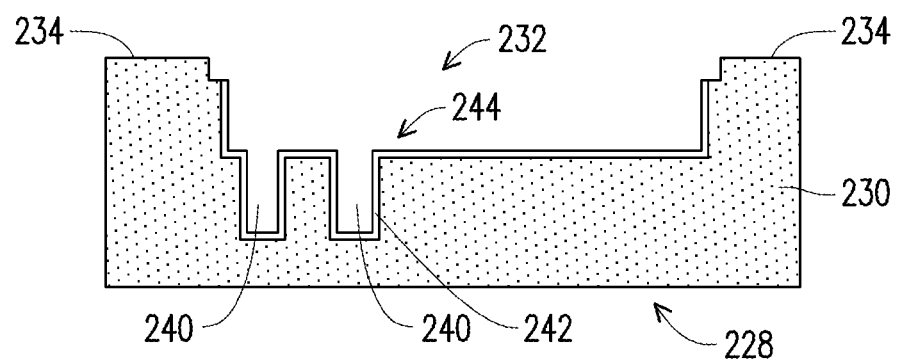
Figure 18:
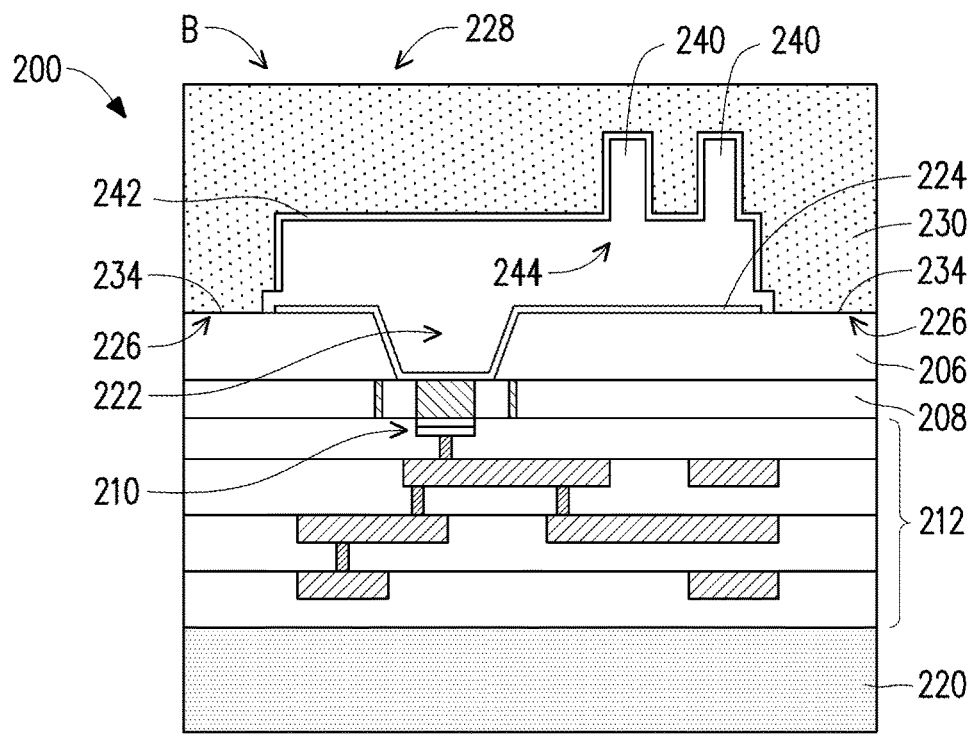
Figure 19:
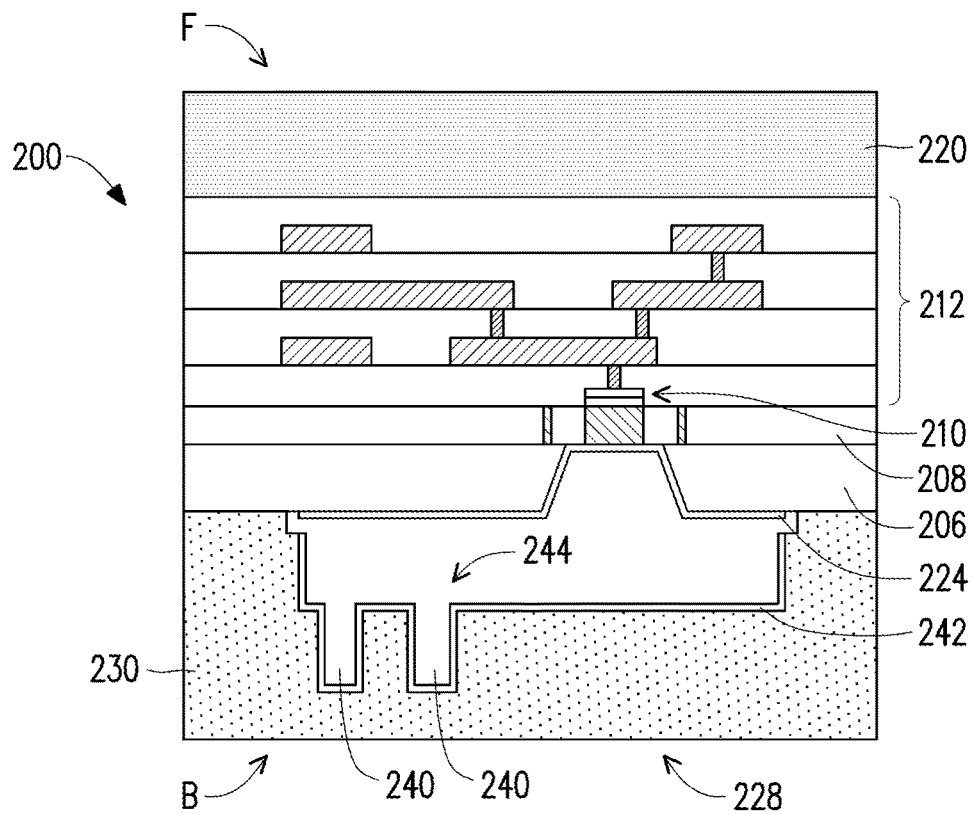

As shown in the example in FIG. 9, the interface layer 224 (e.g., a high-k material layer) is formed on the exposed surface of the trench 222 and the exposed surface of the active region of the FET 210, while two bonding sites 226 are exposed. In other words, the buried oxide layer 206, except for the two bonding sites 226, are covered by the interface layer 224. It should be noted that the shape of the bonding sites may vary depending on the shape of the microfluidic channel cap structure.

The method 300 then proceeds to step 320 where a microfluidic channel cap structure is fabricated. FIG. 3C is a flowchart diagram illustrating the step 320 of the method 300 in accordance with some embodiments. The step 320 is a CMOS-compatible process flow. At step 352, a cap structure substrate is provided. The cap structure substrate may be a silicon substrate, though other suitable materials may be employed. As shown in the example in FIG. 10, a silicon substrate 230 is provided.

At step 354, the cap structure substrate is patterned and etched to predefine a global cavity region. The global cavity region corresponds to the microfluidic channel. A photoresist pattern is formed on the cap structure substrate. The photoresist pattern protects some of the cap structure substrate from a subsequent etch to predefine the global cavity region. After patterning the cap structure substrate, the global cavity region is predefined by etching the cap structure substrate. The etching process may be a wet etch, such as HF/nitric/acetic acid (HNA) or tetramethylammonium hydroxide (TMAH) or dry etch including plasma and non-plasma etch. Afterwards, the photoresist is removed. As shown in the example in FIG. 11, a global cavity region 232 is predefined at the top surface of the cap structure substrate 230.

At step 356, a hard mask is deposited on bonding areas of the cap structure substrate. In some embodiments, the bonding areas of the cap structure substrate correspond to the bonding sites on the buried oxide layer at step 318. Specifically, the bonding areas of the cap structure substrate interface with the bonding sites on the buried oxide layer, and the microfluidic channel cap structure is bonded to the buried oxide layer (or any appropriate intermediate bonding layer deposited and patterned on the buried oxide layer), which will be described in detail below at step 322. The hard mask can protect the bonding areas from subsequent etching processes. In some embodiments, the hard mask may be formed of oxide. In some embodiments, the hard mask may be formed of polysilicon. The hard mask is formed using suitable processes such as CVD and/or the like. In a non-limiting example, the thickness of the hard mask ranges from 0.3 μm to 1 μm. As shown in the example in FIG. 12, the hard mask 236 (e.g., oxide hard mask) is deposited on the bonding areas 234 of the cap structure substrate 230. The hard mask 236 may protect the bonding areas 234 from subsequent etching processes.

At step 358, certain regions of the global cavity region is patterned to form inlet/outlet channels. A photoresist pattern is formed on the hard mask the global cavity region. The photoresist pattern protects the hard mask and some of the global cavity region from a subsequent etch to form the inlet/outlet channels. Subsequently, the cap structure substrate is etched to form the inlet/outlet channels. The etching process may be a wet etch, such as HF/nitric/acetic acid (HNA) or tetramethylammonium hydroxide (TMAH) or dry etch including plasma and non-plasma etch. Afterwards, the photoresist is removed. As shown in the example in FIG. 13, the photoresist pattern 238 is on the hard mask 236 and some of the global cavity region 232. The exposed portion of the global cavity region 232 is etched to form the inlet/outlet channels 240. The photoresist pattern 238 is then removed, and the structure is as shown in the example in FIG. 14. The entire global cavity region 232, including the inlet/outlet channels 240, are exposed, while the bonding areas 234 are covered by the hard mask 236.

At step 360, the entire global cavity region is blanket etched. Specifically, the entire global cavity region, including the inlet/outlet channels, are etched back evenly by a certain depth, to form the chamber of the microfluidic channel cap structure. On the other hand, the bonding areas covered by the hard mask are protected during the blanket etch. The blanket etching process may be any suitable etching processes such as wet etch or dry etch including plasma and non-plasma etch. As shown in the example in FIG. 15, the entire global cavity region 232 of the cap structure substrate 230, including the inlet/outlet channels 240, is etched by a predefined etch depth ED. The predefined etch depth ED corresponds to the desired height of the chamber 244 of the microfluidic channel cap structure 228.

Optionally at step 362, a high-k oxide material layer is deposited on the global cavity region and the hard mask. Step 362 is optional depending on applications. The high-k oxide material layer may be formed using CMOS processes such as, for example, PVD (sputtering), CVD, PECVD, APCVD, LPCVD, HDPCVD, or ALCVD. In one non-limiting example, the high-k oxide material layer has a thickness of 2 nm to 3 nm. As shown in the example in FIG. 16, the high-k oxide material layer 242 is deposited on the global cavity region 232 (thus the chamber 244) and the hard mask 236. The high-k oxide material layer 242 covers the bottom and sidewalls of the chamber 244, the bottom and sidewalls of the inlet/outlet channels, and the hard mask 236.

Optionally at step 364, the interface layer on the top of the hard mask is removed. In one embodiment, a photoresist spray coater may be sprayed, by a spray coating process, to cover the global cavity region. The photoresist spray coater protects the high-k oxide material layer when the high-k oxide material layer on the hard mask is removed. The interface layer on the top of the hard mask is removed by suitable processes such as plasma etching. In an example plasma etching process, a mixture of gasses comprising oxygen, a fluorine-containing material and an inert gas is provided, and a high-speed stream of glow discharge (plasma) of the mixture of gasses is shot (in pulses) at the high-k oxide material layer. The spray coating process is used to coat photoresist over a region with deep features. In the spray coating process, fine droplets of photoresist are deposited onto the structure. The angle at which the photoresist droplets are sprayed permits the photoresist to make its way into the deep trenches and sidewalls.

At step 366, the hard mask is removed. The hard mask is removed by any suitable processes. In one embodiment, the hard mask is removed by wet etch. In some embodiments, the wet etch is a fluorine containing etch, such as dilute hydrofluoric acid (HF). In some embodiments, the wet etch is an ammonia hydroxide/hydrogen peroxide etch. The wet etch removes the hard mask without substantially removing or harming the high-k oxide material layer. As shown in the example in FIG. 17, both the optional high-k oxide material layer 242 on the hard mask 236 and the hard mask 236 are removed. The bonding areas 234 are exposed. The bottom and sidewalls of the global cavity region 232 and inlet/outlet channels 240 are covered with the high-k oxide material layer 242. As such, the microfluidic channel cap structure 228 is fabricated.

Referring back to FIG. 3A, the method 300 proceeds to step 322 where the microfluidic channel cap structure is bonded to the backside of the biosensor system package. Specifically, the microfluidic channel cap structure is bonded to the buried oxide layer. In some embodiments, the bonding sites of the buried oxide layer interface with the bonding areas of the cap structure substrate. In other embodiments, an intermediate bonding layer, that is deposited and patterned on the buried oxide layer, interfaces with the bonding areas of the cap structure substrate. The microfluidic channel cap structure may be bonded to the backside of the biosensor system package using fusion bond, eutectic bond, anodic bond, and/or other suitable bonding methods. Fusion bonding utilizes temperature and pressure to join semiconductor materials. In one non-limiting example, in a room-temperature fusion bonding process, a bonder device forces the microfluidic channel cap structure and the backside of the biosensor system package together. This is followed by an annealing process to increase the bond strength. In a eutectic bond, an intermediate metal layer that can produce a eutectic system is utilized. The eutectic metals are alloys that transform directly from solid to liquid state, or vice versa from liquid to solid state, at a specific composition and temperature without passing a two-phase equilibrium. As the eutectic temperature can be much lower than the melting temperature of the two or more pure elements, the eutectic bond may have the benefits of low processing temperatures, low resultant stress induced in final assembly, high bonding strength, large fabrication yield and a good reliability. In an anodic bond, glasses are sealed to either silicon or metal without introducing an intermediate layer. As shown in the example in FIG. 18, the microfluidic channel cap structure 228 is bonded to the backside (B) of the biosensor system package 200. Specifically, the microfluidic channel cap structure 228 is bonded to the buried oxide layer 206. The bonding sites 226 of the buried oxide layer 206 interface with the bonding areas 234 of the cap structure substrate 230.

Figure 20:
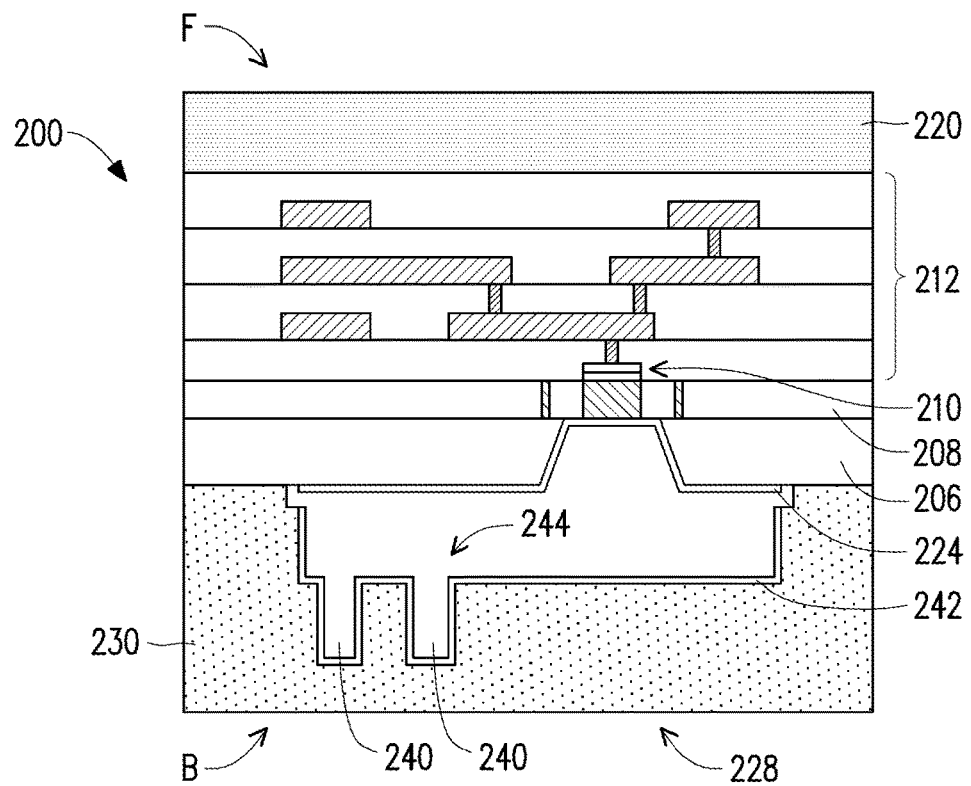
Figure 21:
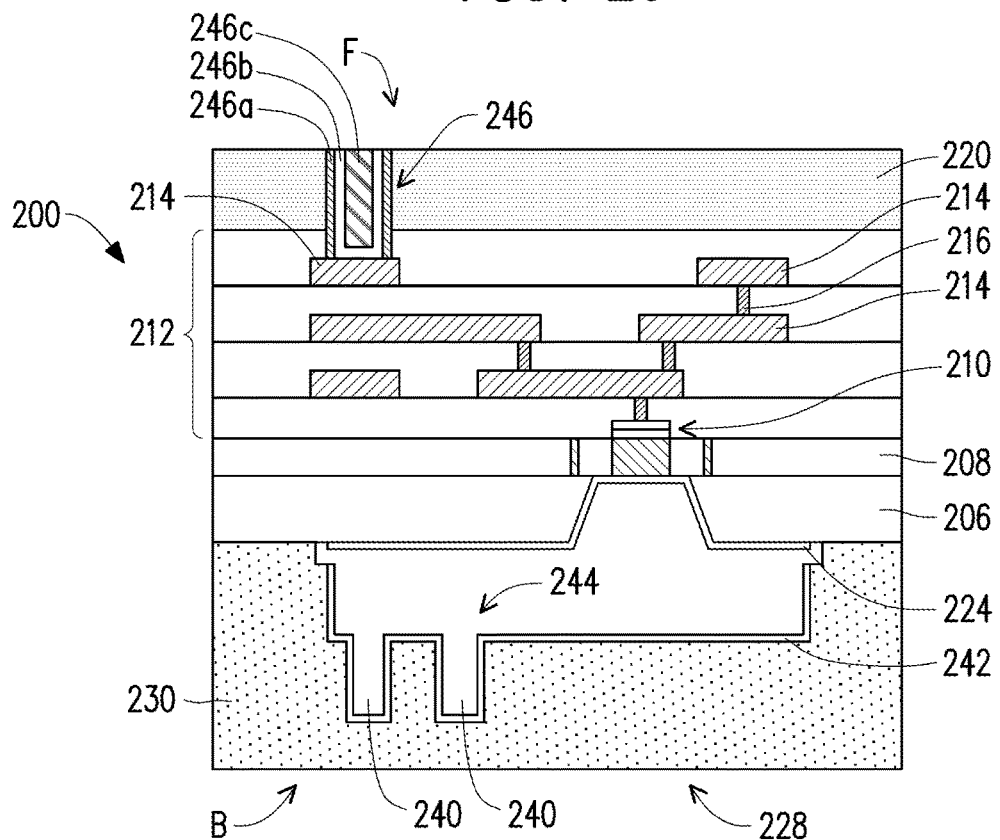

The method 300 then proceeds to step 324 where the wafer is flipped. As shown in the example in FIG. 19, the carrier substrate 220 which is at the front side (F) of the biosensor system package 200 is now on the top. The method 300 then proceeds to step 326 where the carrier substrate is thinned. In one example, the carrier substrate is thinned by grinding. The grinding process may include rotating a disk holding the biosensor system package lined with an appropriate grinding material. It should be noted that other processes such as CMP may also be employed. As shown in FIG. 20, the carrier substrate 220 has been thinned. The thickness of the carrier substrate is selected in accordance with step 328 which will be discussed below.

The method 300 then proceeds to step 328 where a through-substrate via (TSV) structure is created through the carrier substrate and connected to the MLI structure. The TSV is used to provide electrical connections and for heat dissipation for the biosensor system package 200. As shown in the example in FIG. 21, a TSV structure 246 is created through the carrier substrate 220 and connected to the MLI structure 212. Although only one TSV structure 246 is shown in the example in FIG. 21, more than one TSV structure may be formed to pass through the carrier substrate 220. The TSV structure 246 includes a liner 246a, a diffusion barrier layer 246b, and a conductive material 246c. In one embodiment, the TSV structure 246 is formed by the following operations. Firstly, a TSV opening is formed extending to a conductive line 214 of the MLI structure 212 by one or more etching processes. After the TSV opening is formed, the liner 246a is formed on sidewalls of the TSV opening to act as an isolation layer, such that the conductive material 246c of the TSV structure 246 and the carrier substrate 220 do not directly contact with each other. Afterwards, the diffusion barrier layer 246b is conformally formed on the liner 246a and on the bottom of the TSV opening. The diffusion barrier layer 246b is used to prevent the conductive material 246c, which will be formed later, from migrating to undesired regions. After the diffusion barrier layer 246b is formed, the conductive material 246c is used to fill into the TSV opening. Afterwards, excess liner 246a, diffusion barrier layer 246b, and conductive material 246c, which are on the outside of the TSV opening, are removed by a planarization process, such as a chemical mechanical polishing (CMP) process, although any suitable removal process may be used.

The liner 246a is made of an insulating material, such as oxides or nitrides. The liner 246a may be formed by using a PECVD process or other applicable processes. The liner 246a may be a single layer or multi-layers. In some non-limiting examples, the liner 246a has a thickness in a range from about 100 Å to about 5000 Å. The diffusion barrier layer 246b is made of Ta, TaN, Ti, TiN or CoW. In some embodiments, the diffusion barrier layer 246b is formed by a PVD process. In some embodiments, the diffusion barrier layer 246b is formed by plating. In some embodiments, the conductive material 246c is made of copper, copper alloy, aluminum, aluminum alloys, or combinations thereof. Alternatively, other applicable materials may be used. The width, depth, and aspect ratio of the TSV structure 246 may be selected under different circumstances. Since the carrier substrate 220 is thinned at step 326, the TSV structure 246 has a relatively small aspect ratio. As such, the void problems and the extrusion or diffusion problems resulting from a high aspect ratio of the TSV structure are resolved or greatly reduced. In addition, the overall package height of the biosensor system package 200 is reduced to meet advanced packaging requirements. As such, the biosensor system package 200 may achieve a small form factor.

The method 300 then proceeds to step 330 where the wafer is flipped. As shown in the example in FIG. 22, the microfluidic channel cap structure 228 is on the top, whereas the TSV structure 246 is at the bottom. The method 300 then proceeds to step 332 where the microfluidic channel cap structure is thinned to form the inlet/outlet ports 240' as shown in the example in FIG. 23. The microfluidic channel cap structure 228 is thinned by any suitable processes such as grinding and CMP. After thinning the microfluidic channel cap structure 228, the inlet/outlet channels 240 are exposed to form the inlet/outlet ports 240'. As such, the chamber 244 can be connected outside through the inlet/outlet ports 240'.

Figure 22:
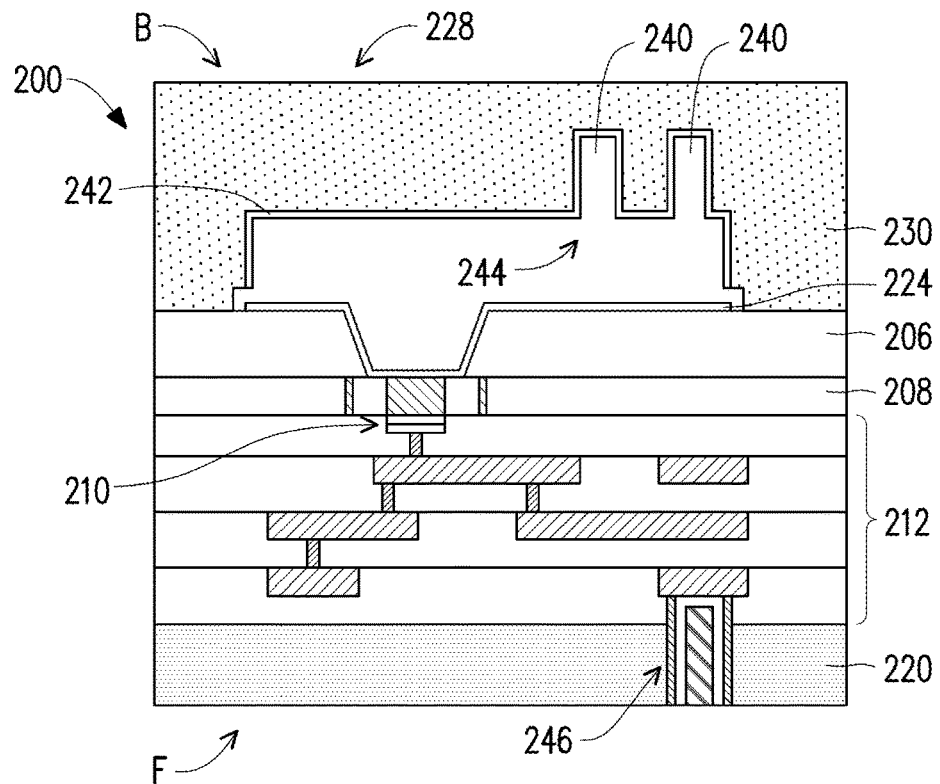
Figure 23:
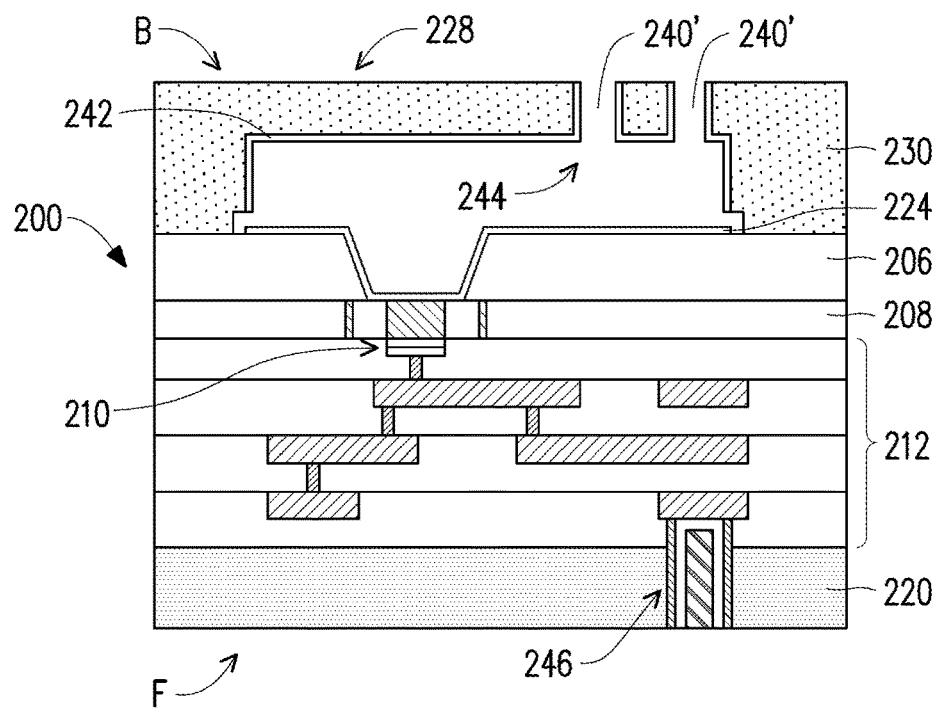
Figure 24:
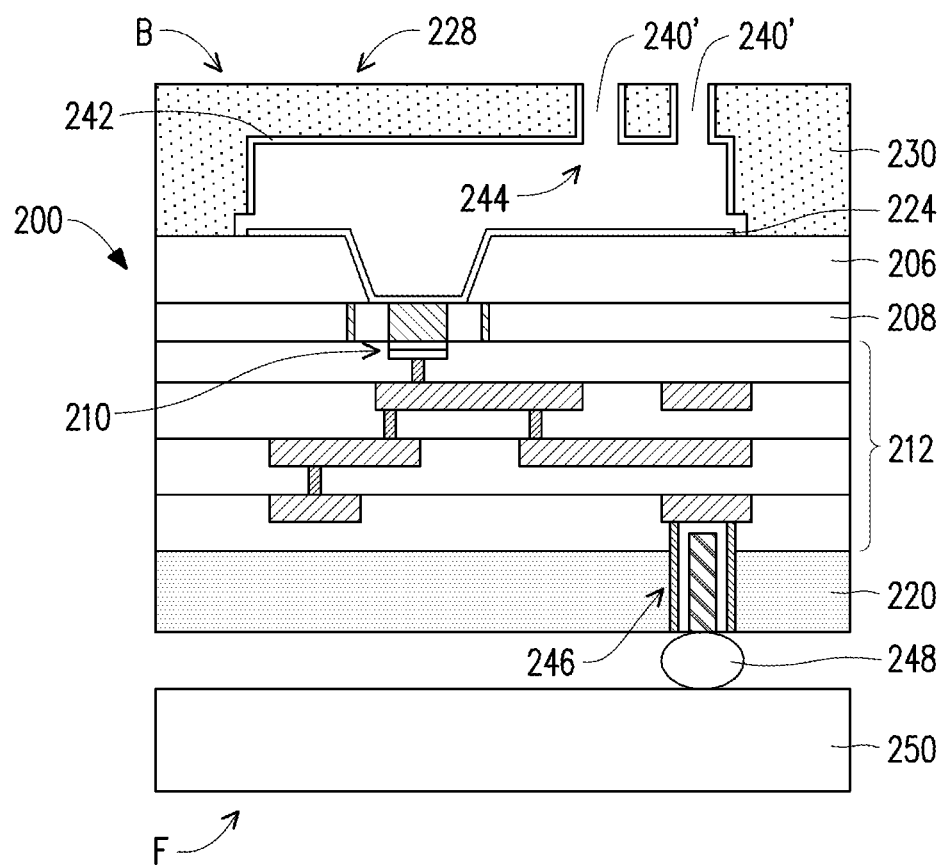

Alternatively at step 334, the microfluidic channel cap structure may be thinned first and then certain areas are etched to form the inlet/outlet ports. However, some inlet/outlet channels are not etched due to the cover of photoresist in the etching process, therefore forming a second chamber height, which is higher than the height of the chamber (e.g., the chamber 244 as shown in FIG. 22). The microfluidic channel cap structure is first thinned by any suitable processes such as grinding and CMP. However, the depth of thinning is selected such that the inlet/outlet channels are not exposed after the thinning. In one example where two inlet/outlet channels (e.g., the inlet/outlet channels 240 as shown in FIG. 22) have been fabricated, certain areas (e.g., the region over one of the two inlet/outlet channels) are etched to expose one of the two inlet/outlet channels, thus forming one inlet/outlet port. However, the region over the other inlet/outlet channel is not etched, therefore forming a second chamber height. The second chamber height is equal to the height of the chamber plus the height of the inlet/outlet channel. The alternative step 334 offers more flexibility and can be applied to a chamber having two different heights (i.e., the chamber height and the second chamber height), compared with step 332.

The method 300 then proceeds to step 336 where the wafer is flipped. After the wafer is flipped, the carrier substrate 220 and the TSV structure 246 are on the top. Then the method 300 proceeds to step 338 where a separate chip is bonded to the TSV structure. The separate chip may be any chips that function as a portion of the biosensor system. In one embodiment, the separate chip is a RAM chip. In one embodiment, the separate chip is a data processing chip. In one embodiment, the separate chip is a RAM and data processing chip. The separate chip may be bonded to the TSV structure by any suitable processes. In one embodiment, the separate chip is bonded to the TSV structure by solder bump bonding. Solder Bumps are the small spheres of solder (solder balls) that are bonded to contact areas or pads of semiconductor devices. In one example, the solder bump bonding includes the following operations: placing solder bump(s) on the TSV structures; flipping the wafer; aligning the solder bump(s) with contact pad(s) of the separate chip; and reflowing the solder bump(s) in a furnace to establish the bonding between the TSV structure and the separate chip. In other embodiments, the separate chip may be bonded to the TSV structure by wire bonding. As shown in the example in FIG. 24, a RAM and data processing chip 250 is bonded to the TSV structure 246 by solder bumps bonding (using a solder bump 248) and the wafer is flipped back. As such, the biosensor system package 200 is fabricated using the method 300.

Figure 25A:
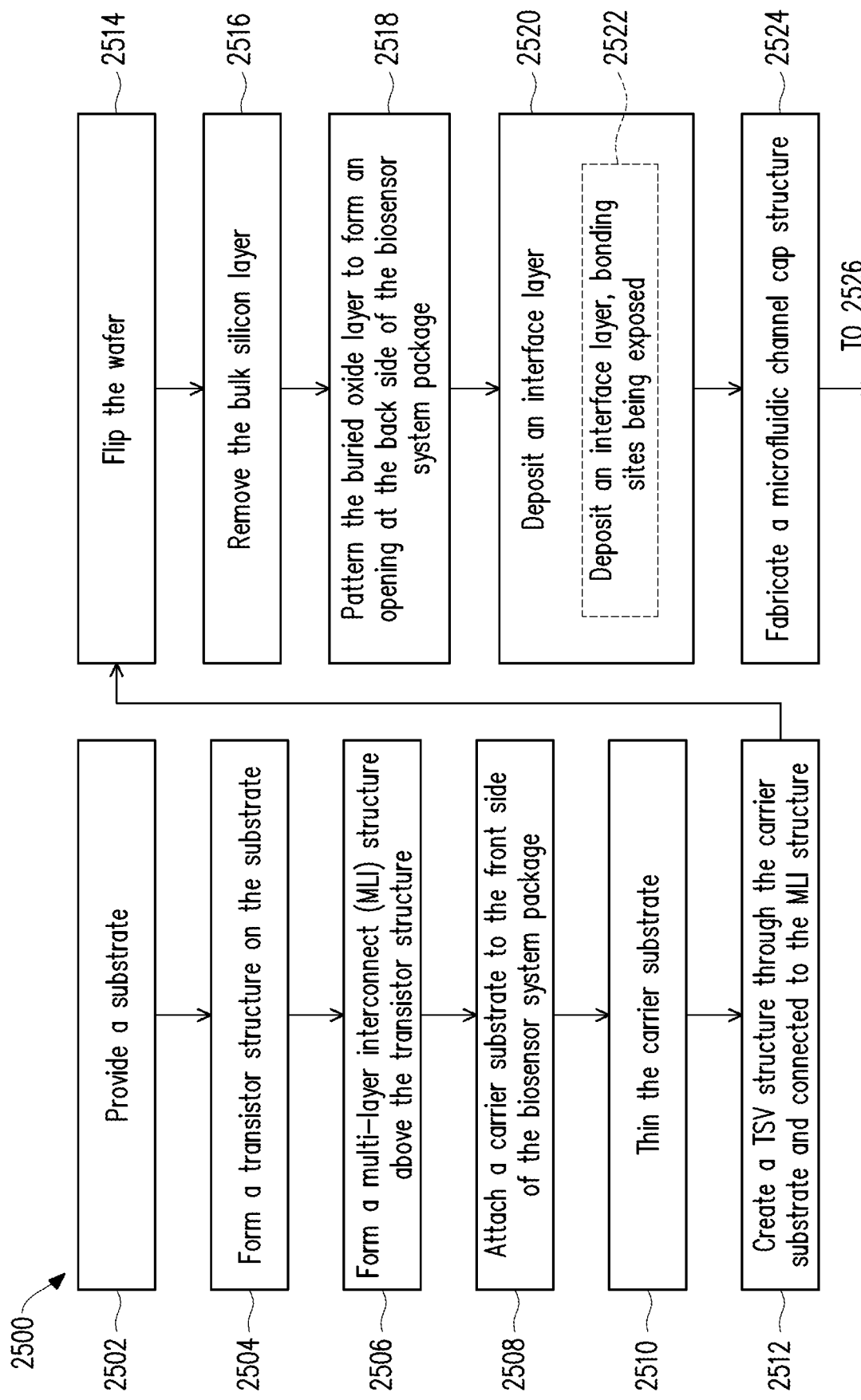
FIG. 25A and FIG. 25B are flowchart diagrams illustrating another method of fabricating a biosensor system package in accordance with some embodiments.
Figure 25B:
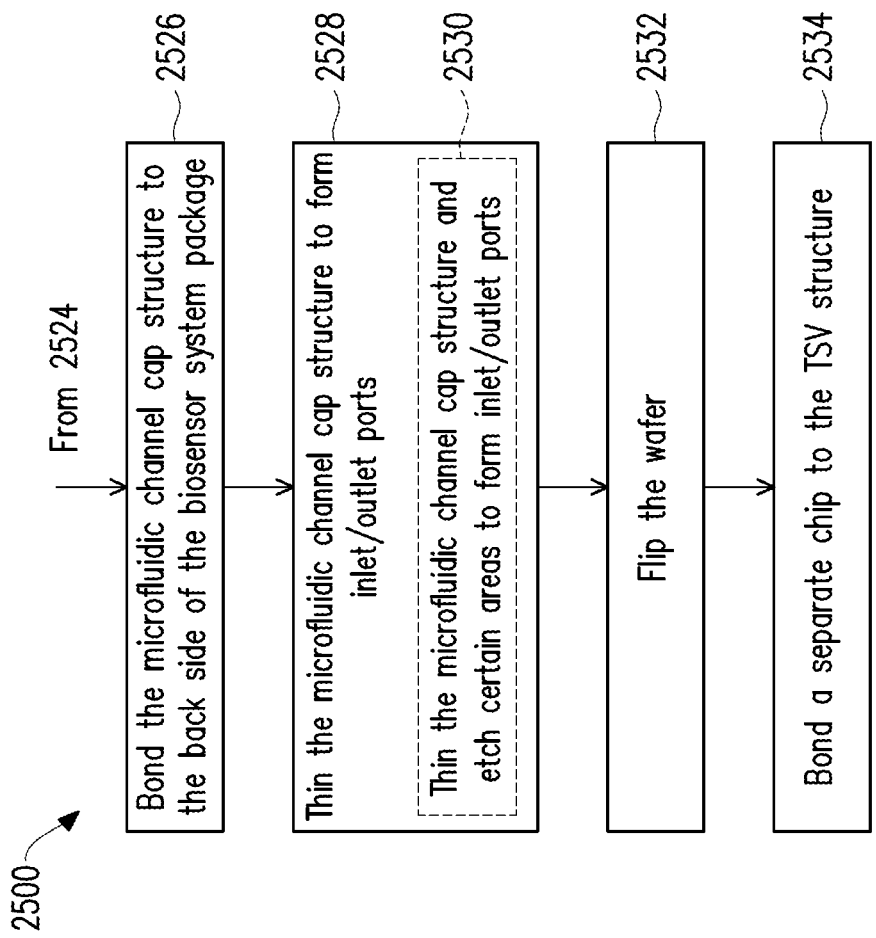

FIG. 25A and FIG. 25B are flowchart diagrams illustrating another method 2500 of fabricating a biosensor system package in accordance with some embodiments. FIGS. 26-30 are cross-sectional diagram illustrating the biosensor system package 3000 constructed according to one or more steps of the method of FIG. 25A and FIG. 25B in accordance with some embodiments. The method 2500 is the same as the method 300 in FIGS. 3A-3B, except that the TSV structure is fabricated before bonding the microfluidic channel cap structure in the method 2500. Therefore, some steps of the method 2500 are not described in detail for simplicity as similar steps have been described above.

The method 2500 begins at step 2502, which is similar to step 302 in FIG. 3A, where a substrate is provided. The substrate may be a semiconductor substrate (e.g., wafer). In one example, the semiconductor substrate may be a SOI substrate which includes a bulk silicon layer, a buried oxide (BOX) layer, and a semiconductor layer (i.e., an active layer). The method 2500 then proceeds to step 2504, which is similar to step 304 in FIG. 3A, where a transistor structure is formed on the substrate. The transistor structure (i.e., the FET) may include a gate structure, a source region, a drain region, and a channel region interposing the source and drain regions. The method 2500 then proceeds to step 2506, which is similar to step 306 in FIG. 3A, where a MLI structure is formed above the transistor structure. The MLI structure may include conductive lines, conductive vias, and/or interposing dielectric layers (e.g., ILD layers). The MLI structure may provide physical and electrical connection to the transistor (i.e., the FET). The method 2500 then proceeds to step 2508, which is similar to step 308 in FIG. 3A, where a carrier substrate is attached to the front side (F). In other words, the carrier substrate is attached to the MLI structure. The carrier substrate may protect the front side (F) during subsequent steps. In one embodiment, the carrier substrate is bonded to the MLI structure. The carrier substrate may be attached using fusion, diffusion, eutectic, and/or other suitable bonding methods.

The method 2500 then proceeds to step 2510, which is similar to step 326 in FIG. 3B, where the carrier substrate is thinned. In one example, the carrier substrate is thinned by grinding. It should be noted that other processes such as CMP may also be employed. The thickness of the carrier substrate is selected in accordance with step 2512 which will be discussed below. The method 2500 then proceeds to step 2512, which is similar to step 328, where a TSV structure is created through the carrier substrate and connected to the MLI structure. The TSV is used to provide electrical connections and for heat dissipation for the biosensor system package. In one embodiment, the TSV structure is formed by the following operations. Firstly, a TSV opening is formed extending to a conductive line of the MLI structure by one or more etching processes. After the TSV opening is formed, the liner is formed on sidewalls of the TSV opening to act as an isolation layer, such that the conductive material of the TSV structure and the carrier substrate do not directly contact with each other. Afterwards, the diffusion barrier layer is conformally formed on the liner and on the bottom of the TSV opening. The diffusion barrier layer is used to prevent the conductive material, which will be formed later, from migrating to undesired regions. After the diffusion barrier layer is formed, the conductive material is used to fill into the TSV opening. Afterwards, excess liner, diffusion barrier layer, and conductive material, which are on the outside of the TSV opening, are removed by a planarization process, such as a CMP process.

Figure 26:
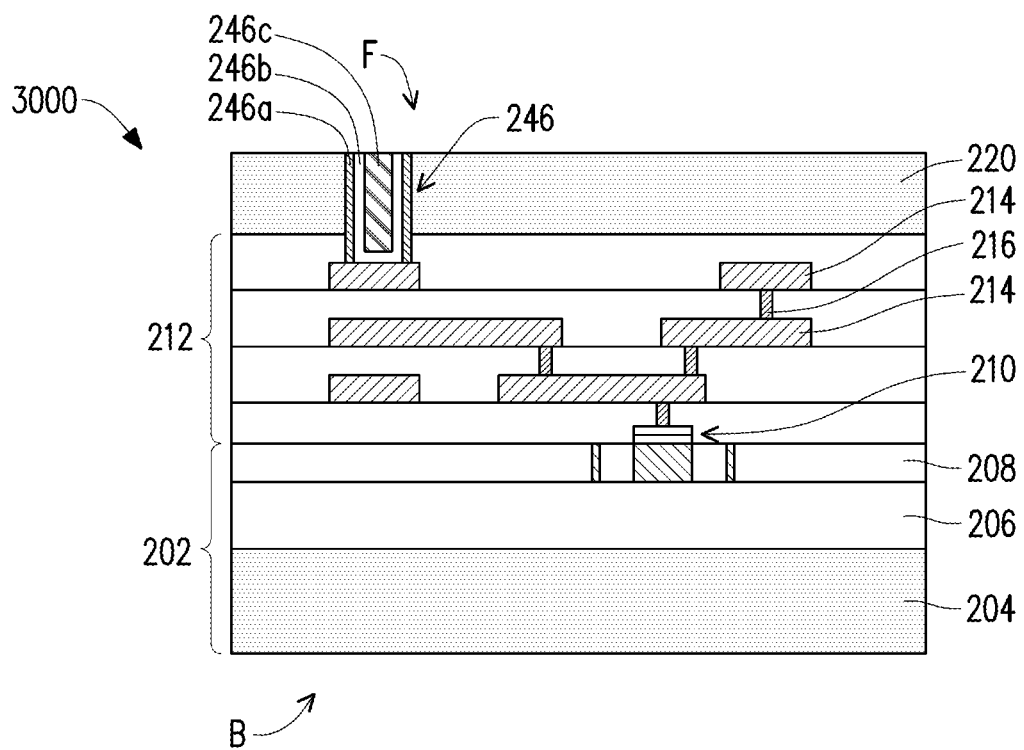
FIGS. 26-30 are cross-sectional diagrams illustrating the biosensor system package constructed according to one or more steps of the method of FIG. 25A and FIG. 25B in accordance with some embodiments.
Figure 27:
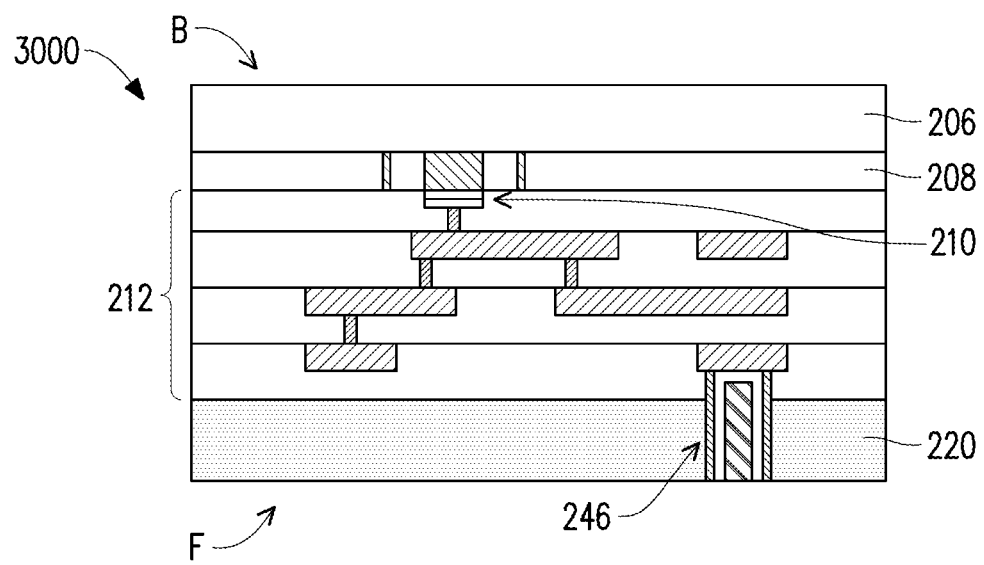

As shown in the example in FIG. 26, the TSV structure 246 is created through the carrier substrate 220 at the front side (F) and connected to the MLI structure 212. The TSV structure 246 includes the liner 246a, the diffusion barrier layer 246b, and the conductive material 246c. The SOI substrate 202 at the back side (B) shown in FIG. 26 includes the bulk silicon layer 204, the buried oxide (BOX) layer 206, and the semiconductor layer 208 (i.e., the active layer 208). The transistor structure (i.e., the FET) 210 is be formed on an active region in the semiconductor layer 208.

The method 2500 then proceeds to step 2514 where the wafer is flipped. After step 2514, the bulk silicon layer is on the top. The method 2500 then proceeds to step 2516, which is similar to step 312 in FIG. 3A, where the bulk silicon layer is removed. The removal may be accomplished by mechanical or chemical means. For example, a mechanical means includes polishing or grinding, such as CMP. A chemical means includes wet etch or dry etch. As shown in the example in FIG. 27, the bulk silicon layer 204 in FIG. 26 is removed. The buried oxide layer 206 is on the top at the back side (B).

The method 2500 then proceeds to step 2518, which is similar to step 314 in FIG. 3A, where the buried oxide layer is patterned to form an opening at the back side (B). A photoresist pattern is formed on the buried oxide layer. In some embodiments, the photoresist pattern protects some of the buried oxide layer from the subsequent non-plasma etch to expose the active region of the transistor structure formed at step 2504. The non-plasma etch may be a wet etch or a dry etch that does not involve plasma. In some embodiments, a two-step etch process may be employed to form the opening at the back side (B). The first etching step contains plasma and the second etching step is a non-plasma etch. As shown in the example in FIG. 28, the non-plasma etch forms a trench 222 having a bottom exposing the channel region of the FET 210. A non-plasma etch is used to avoid plasma-induced damage (PID) at the exposed surface of the channel region 219.

The method 2500 then proceeds to step 2520, which is similar to step 316, where an interface layer is deposited. In one embodiment, the interface layer is a high-k material layer. The interface layer is compatible (e.g., friendly) for biomolecules or bio-entities binding. For example, the interface layer may provide a binding interface for biomolecules or bio-entities. In some embodiments, the interface layer includes a plurality of layers. For instance, the interface layer may include a dielectric material (e.g., a high-k material), a conductive material, and/or other suitable material for holding a receptor. The interface layer may be formed using CMOS processes such as, for example, PVD (sputtering), CVD, PECVD, APCVD, LPCVD, HDPCVD, or ALCVD. As shown in the example in FIG. 28, the interface layer 224 (e.g., a high-k material layer) is formed on the exposed surface of the trench 222 and the exposed surface of the active region of the FET 210. Additionally, the interface layer 224 is deposited over the entire surface of the buried oxide layer 206.

Alternatively at step 2522, which is similar to step 318 in FIG. 3A, an interface layer is deposited while some bonding sites are exposed. The bonding sites are used for bonding a microfluidic channel cap structure to the back side (B), which will be described in detail below at step 2524. It should be noted that whether bonding sites are required depends on specific bonding requirements.

Figure 28:
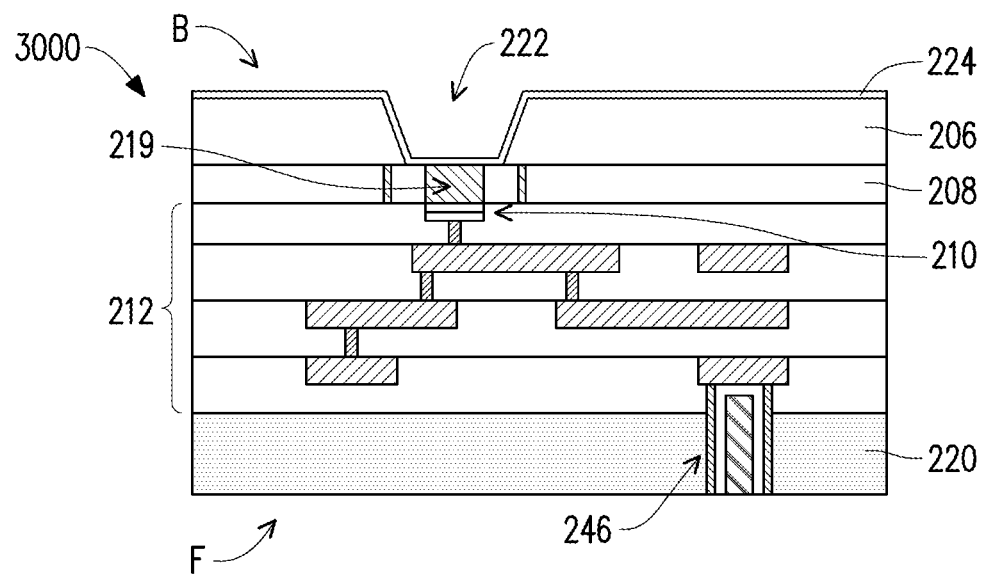

As shown in the example in FIG. 28, the interface layer 224 (e.g., a high-k material layer) is formed on the exposed surface of the trench 222 and the exposed surface of the active region of the FET 210. In other words, the buried oxide layer 206 is covered by the interface layer 224. It should be noted that bonding sites may be employed in some embodiments.

The method 2500 then proceeds to step 2524, which is similar to step 320 in FIG. 3A. In one embodiment, the step 2524 includes steps 352-366 in FIG. 3C. The step 2524 is compatible with CMOS processes. The method 2500 then proceeds to step 2526, which is similar to step 322 in FIG. 3A, where the microfluidic channel cap structure is bonded to the backside of the biosensor system package. Specifically, the microfluidic channel cap structure is bonded to the buried oxide layer. In other embodiments, an intermediate bonding layer, that is deposited and patterned on the buried oxide layer, interfaces with the bonding areas of the cap structure substrate. The microfluidic channel cap structure may be bonded to the backside of the biosensor system package using fusion bond, eutectic bond, anodic bond, and/or other suitable bonding methods.

The method 2500 then proceeds to step 2528, which is similar to step 332, where the microfluidic channel cap structure is thinned to form the inlet/outlet ports. The microfluidic channel cap structure is thinned by any suitable processes such as grinding and CMP. After thinning the microfluidic channel cap structure, the inlet/outlet channels are exposed to form the inlet/outlet ports.

Figure 29:
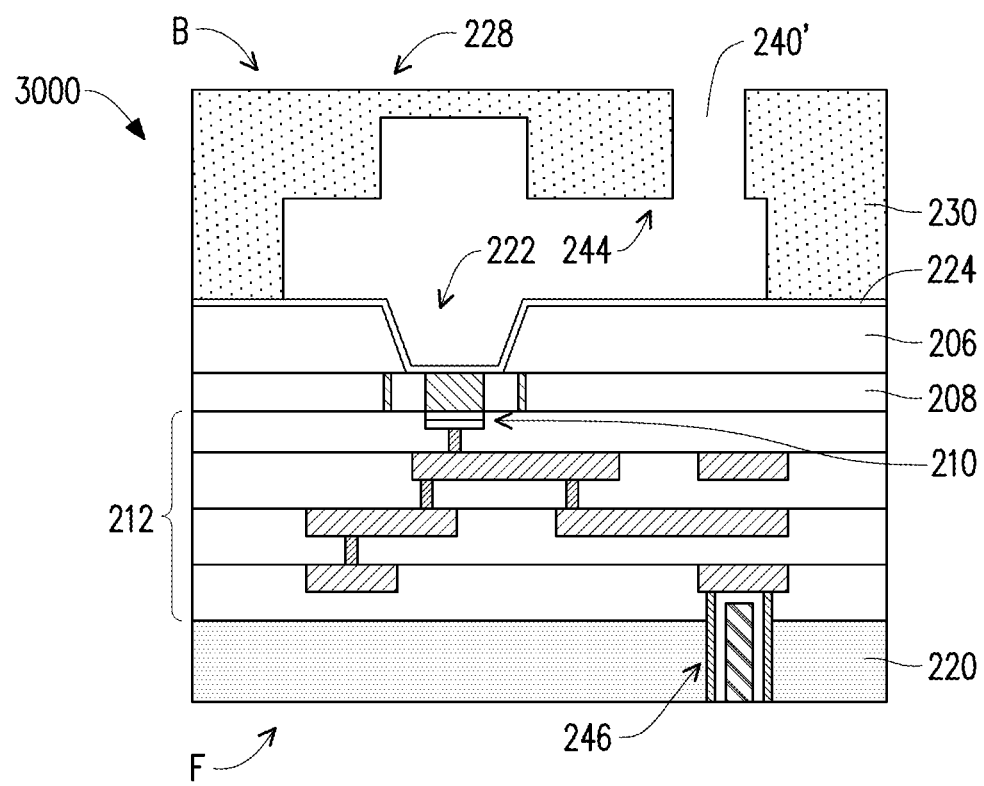
Figure 30:
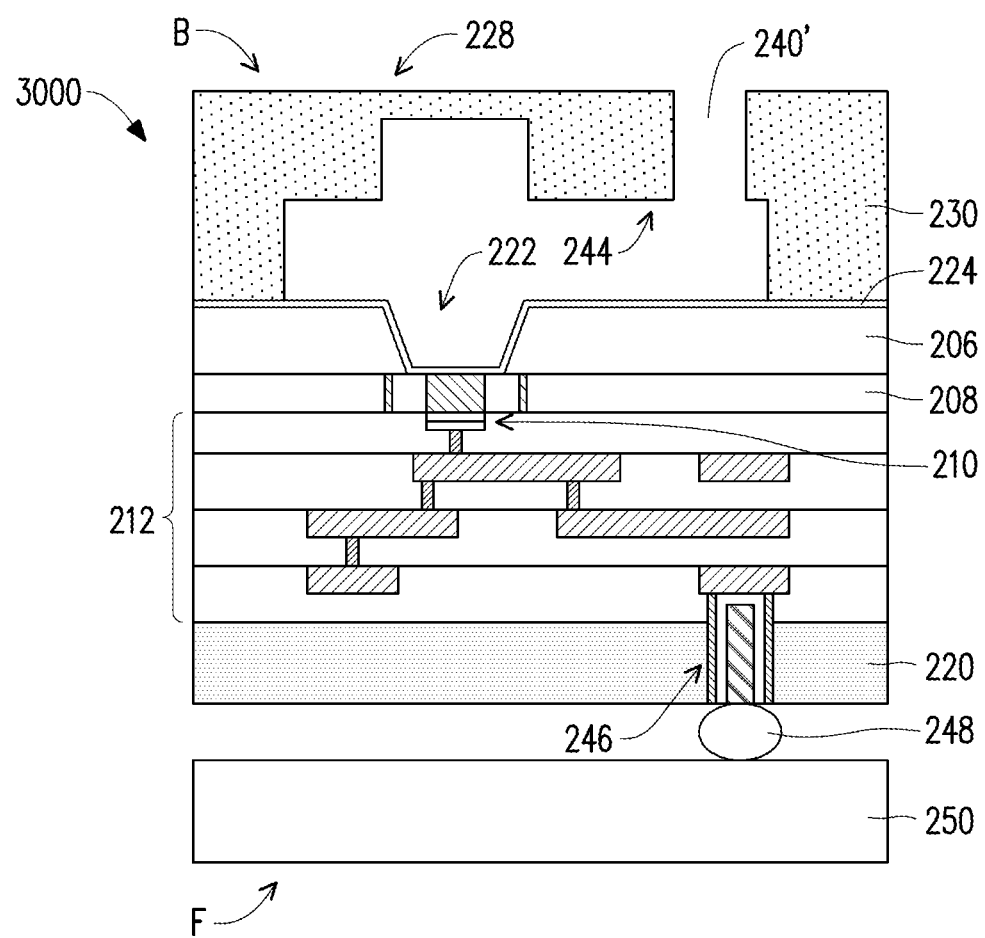

Alternatively at step 2530, which is similar to step 334, where the microfluidic channel cap structure may be thinned first and then certain areas are etched to form the inlet/outlet ports. However, some inlet/outlet channels are not etched due to the cover of photoresist in the etching process, therefore forming a second chamber height, which is higher than the height of the chamber (e.g., the chamber 244 as shown in FIG. 29). The microfluidic channel cap structure is first thinned by any suitable processes such as grinding and CMP. However, the depth of thinning is selected such that the inlet/outlet channels are not exposed after the thinning. In one example where two inlet/outlet channels have been fabricated, certain areas (e.g., the region over one of the two inlet/outlet channels) are etched to expose one of the two inlet/outlet channels, thus forming one inlet/outlet port. However, the region over the other inlet/outlet channel is not etched, therefore forming a second chamber height. The second chamber height is equal to the height of the chamber plus the height of the inlet/outlet channel. Again, the alternative step 2530, which is similar to step 334, offers more flexibility and can be applied to a chamber having two different heights (i.e., the chamber height and the second chamber height), compared with step 2528. As such, a chamber can be connected outside through the inlet/outlet port. As shown in the example in FIG. 29, a microfluidic channel cap structure 228 is bonded to the back side (B). A chamber 244 having two different heights within a cap structure substrate 230 is connected outside through an inlet/outlet port 240'.

The method 2500 then proceeds to step 2532 where the wafer is flipped. After the wafer is flipped, the carrier substrate and the TSV structure are on the top. Then the method 2500 proceeds to step 2534 where a separate chip is bonded to the TSV structure. The separate chip may be any chips that function as a portion of the biosensor system. In one embodiment, the separate chip is a RAM and data processing chip. The separate chip may be bonded to the TSV structure by any suitable processes. In one embodiment, the separate chip is bonded to the TSV structure by solder bump bonding. As shown in the example in FIG. 30, a RAM and data processing chip 250 is bonded to the TSV structure 246 by solder bumps bonding (using a solder bump 248) and the wafer is flipped back afterwards. As such, the biosensor system package 3000 is fabricated using the method 2500.

Figure 31:
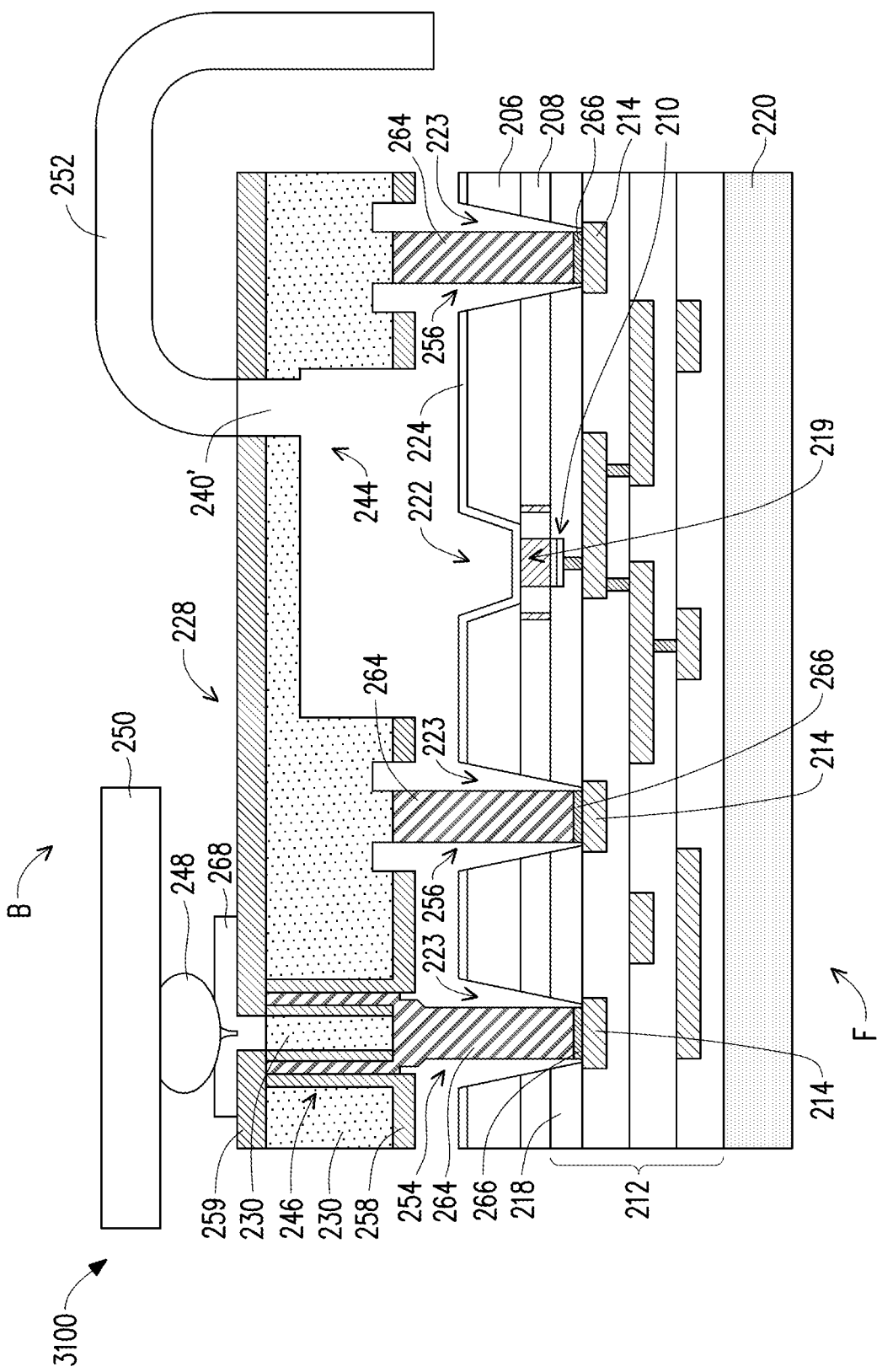
FIG. 31 is a cross-sectional diagram illustrating a biosensor system package in accordance with some embodiments.
Figure 32A:
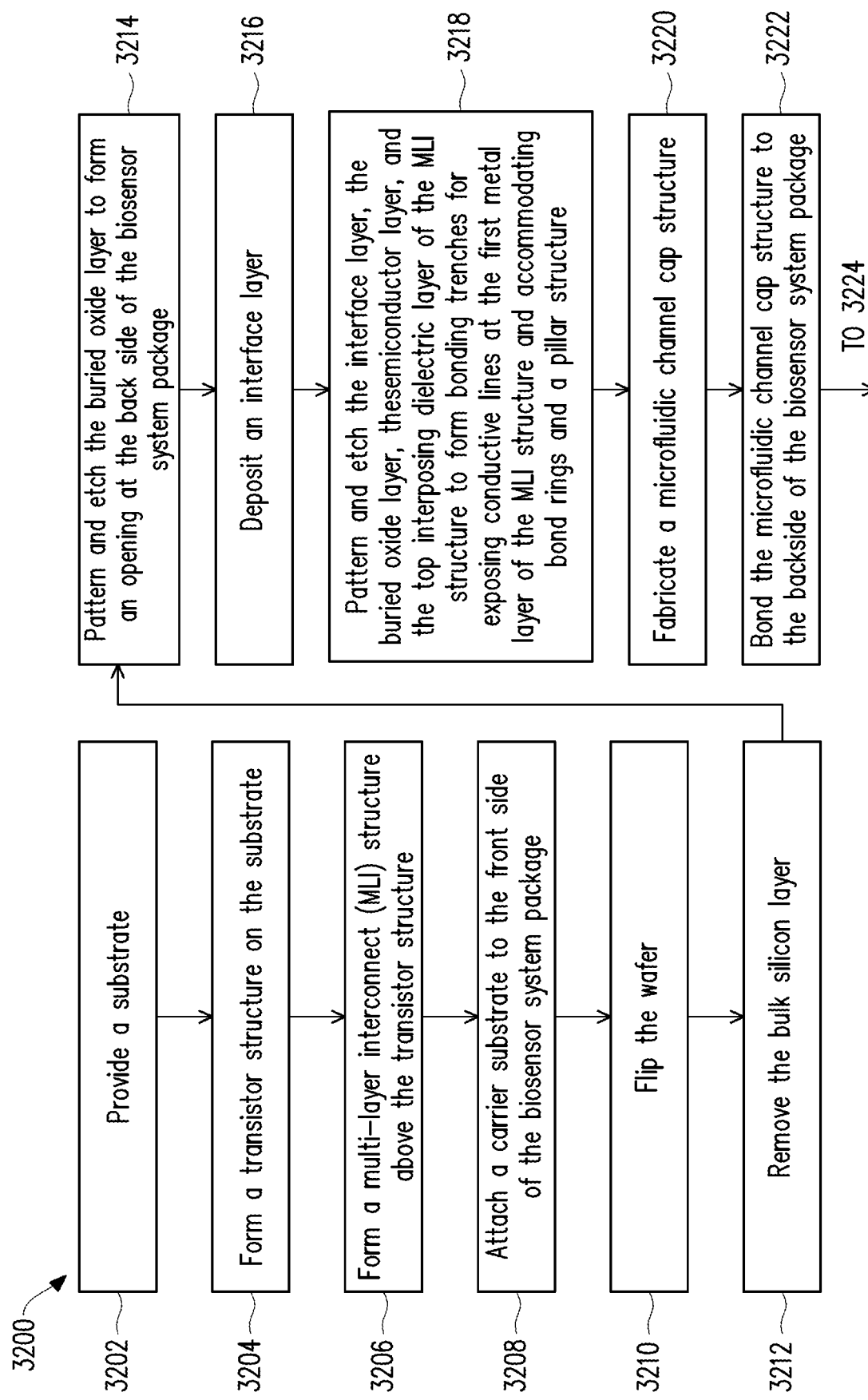
FIG. 32A and FIG. 32B are flowchart diagrams illustrating a method of fabricating the biosensor system package of FIG. 31 in accordance with some embodiments.
Figure 32B:
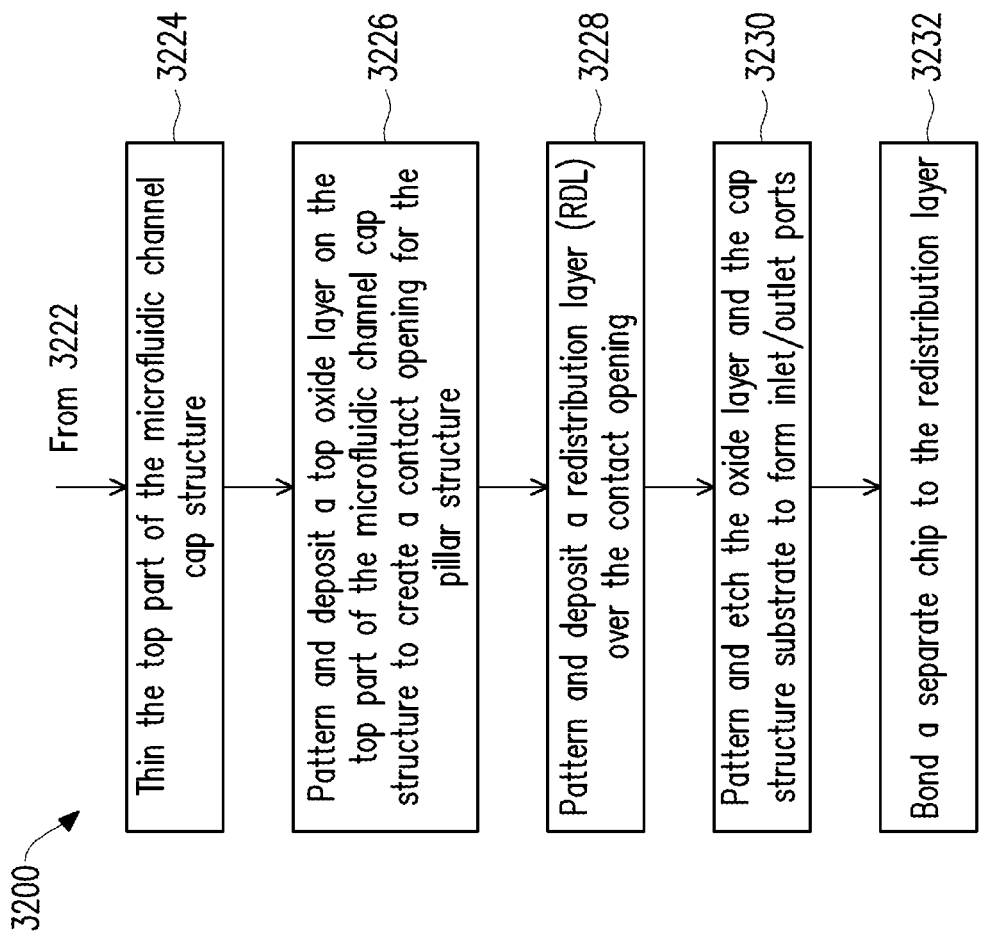
Figure 32C:
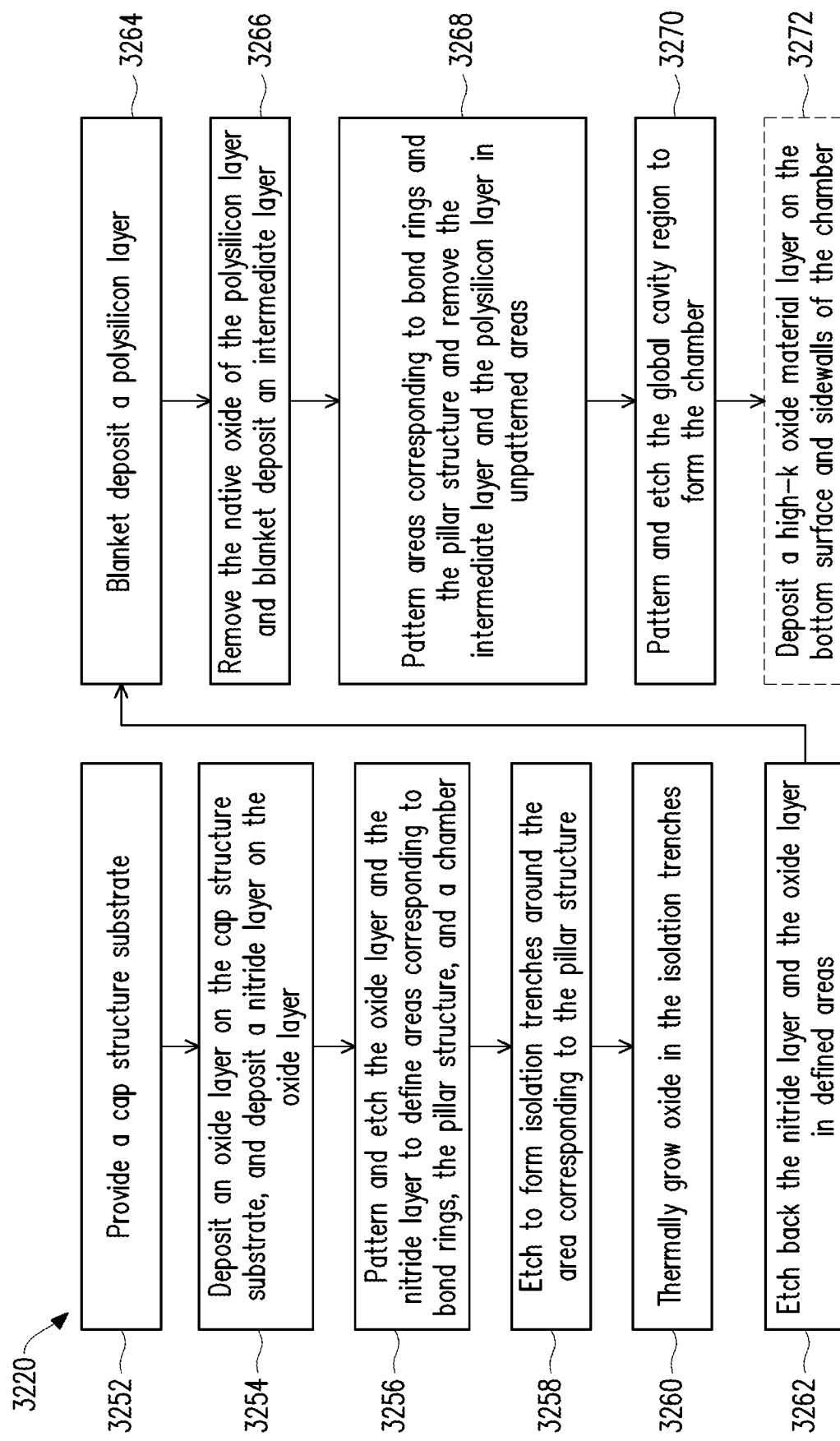
FIG. 32C is a flowchart diagram illustrating a step of the method of FIGS. 32A-32B in accordance with some embodiments.
Figure 33:
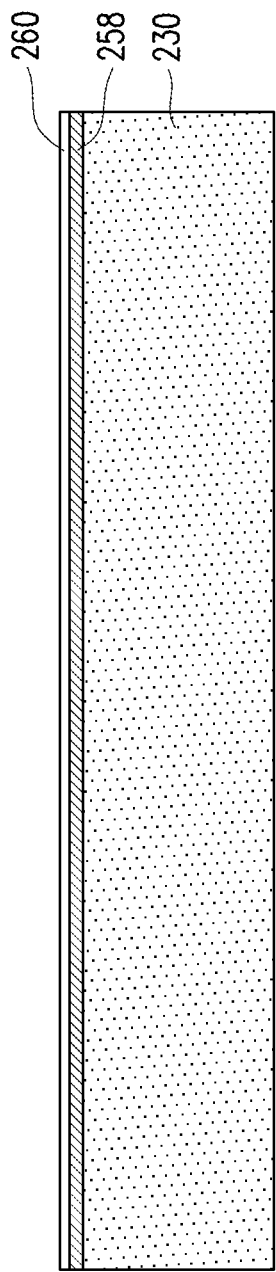
Figure 34:
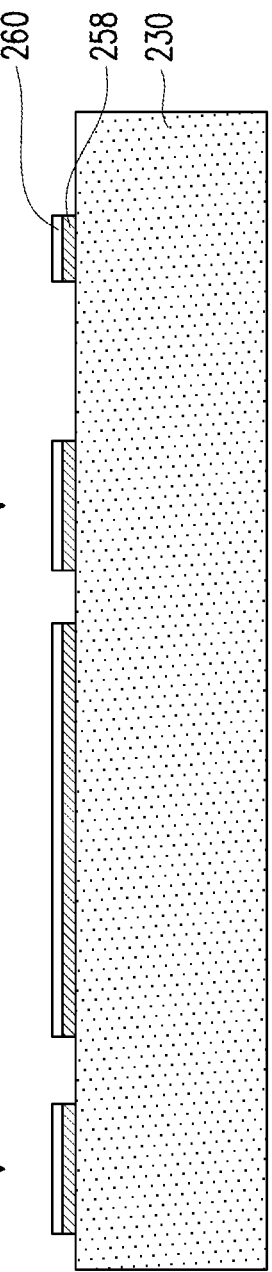
Figure 37:
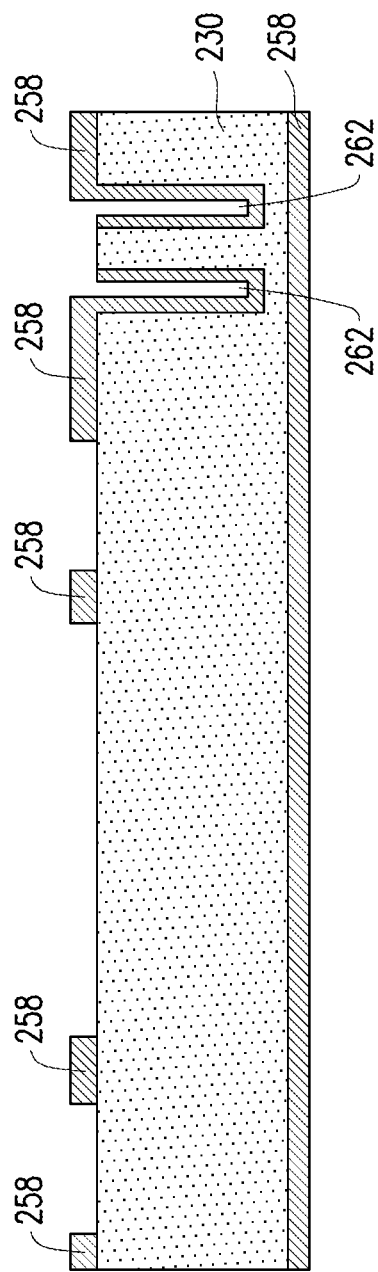
Figure 38:
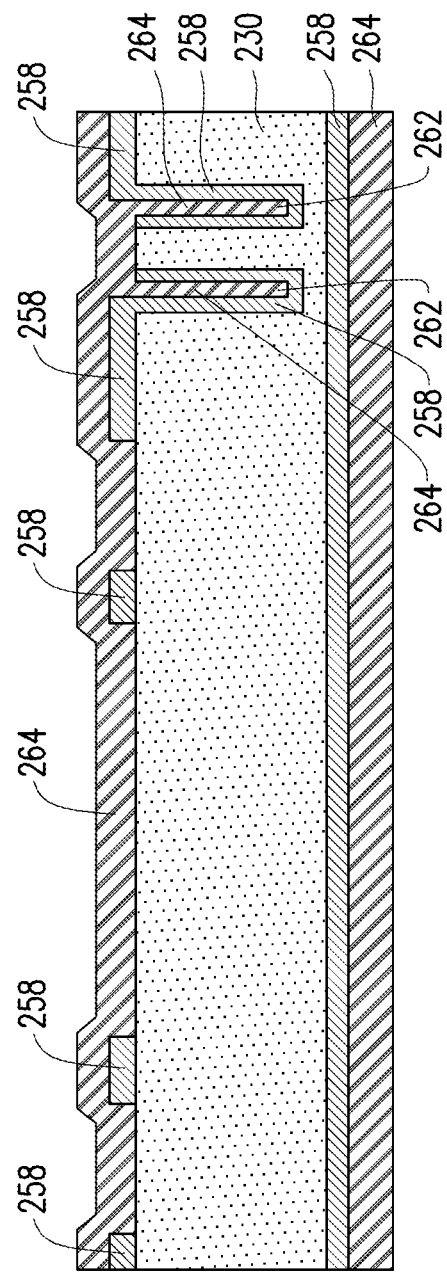
Figure 41:
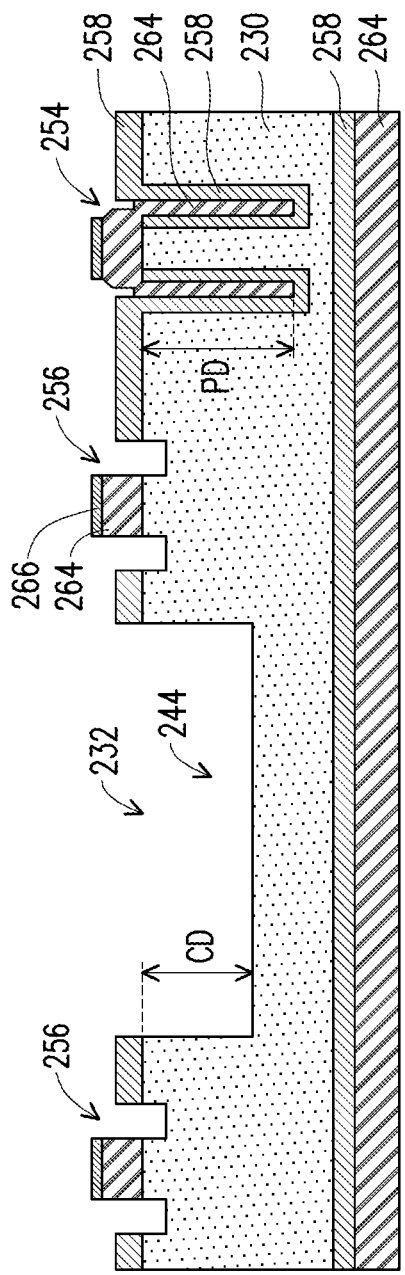
Figure 42:
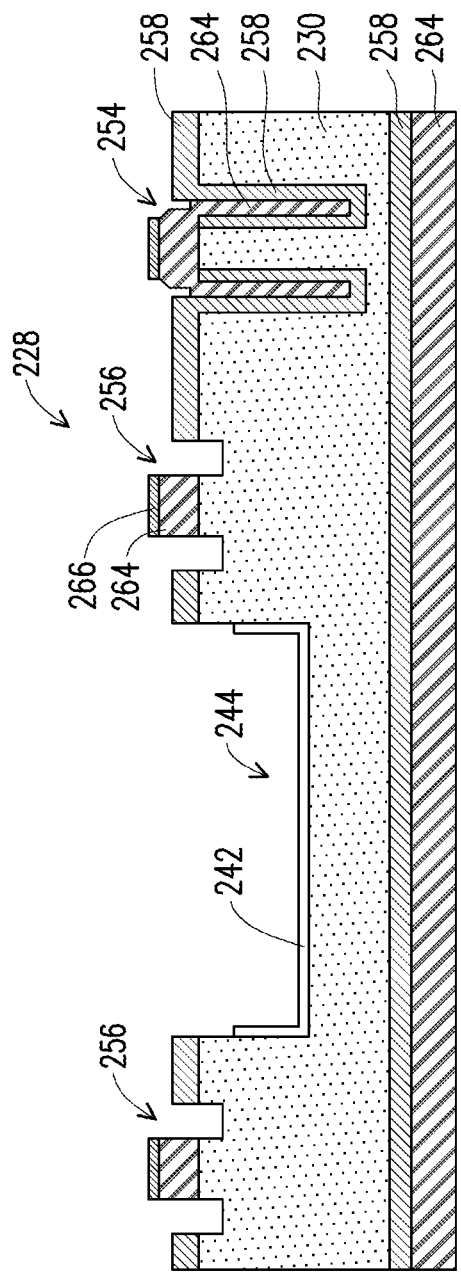

FIG. 31 is a cross-sectional diagram illustrating a biosensor system package 3100 in accordance with some embodiments. FIG. 32A and FIG. 32B are flowchart diagrams illustrating a method 3200 of fabricating the biosensor system package of FIG. 31 in accordance with some embodiments. FIG. 32C is a flowchart diagram illustrating a step of fabricating a microfluidic channel cap structure of the method 3200 of FIGS. 32A-32B in accordance with some embodiments. FIGS. 33-47 are cross-sectional diagram illustrating the biosensor system package constructed according to one or more steps of the method of FIG. 32A and FIG. 32B in accordance with some embodiments. It should be noted that FIGS. 31 and 33-47 are schematic and are not drawn to scale. Different from the biosensor system package 200 of FIG. 2, a separate chip is bonded to the back side (B) and connected to a MLI structure 212 through a via structure 246 through a microfluidic channel cap structure 228. As many structures and steps are similar to those described above, differences will be emphasized below.

As shown in FIG. 31, the biosensor system package 3100 has a front side (F) and a back side (B). In the example shown in FIG. 31, the biosensor system package 3100 includes, among other things, a buried oxide (BOX) layer 206, and a semiconductor layer 208, a transistor structure (i.e., a FET) 210, an MLI structure 212, a carrier substrate 220, a trench 222, three bonding trenches 223, an interface layer (e.g., a high-k material layer) 224, a microfluidic channel cap structure 228, a redistribution layer (RDL) 268, a solder bump 248, and a separate chip (e.g., a RAM and data processing chip) 250. The microfluidic channel cap structure 228 is attached to the back side (B). The microfluidic channel cap structure 228 includes, among other things, a cap structure 230, a chamber 244, inlet/outlet ports 240', a TSV structure 246, a pillar structure 254, two bond rings 256, an oxide layer 258, and a top oxide layer 259. The chamber 244 can hold fluid samples to be tested. The inlet/outlet ports 240' can be connected to pumps and/or reservoirs through tube(s) 252. The separate chip 250 is connected, through the TSV structure 246 and the pillar structure 254, to at least one of the conductive lines at the first metal layer (e.g., conductive lines at the first metal layer "M1") 214 of the MLI structure 212. The microfluidic channel cap structure 228 is bonded to conductive lines 214 of the MLI structure 212 through the pillar structure 254 and the bond rings 256. Details of the components of the biosensor system package 3100 will be described below with reference to FIGS. 32A-32C and 33-47.

As shown in FIG. 32A and FIG. 32B, the method 3200 is used to fabricate a biosensor system package 3100 as shown in FIG. 31. It should be noted that additional steps can be provided before, during, and after the method 3200, and some of the steps described below can be replaced or eliminated, for additional embodiments of the method. Further, it should be noted that the method 3200 includes steps having features of a typical CMOS technology process flow and thus, are only described briefly herein.

The method 3200 begins at step 3202 where a substrate is provided. The substrate includes a bulk silicon layer, a buried oxide layer (e.g., the buried oxide layer 206 shown in FIG. 31), and a semiconductor layer (e.g., the semiconductor layer 208 shown in FIG. 31). At step 3204, a transistor structure (e.g., a FET 210 shown in FIG. 31) is formed on the substrate. At step 3206, a MLI structure (e.g., the MLI structure 212 shown in FIG. 31) is formed above the transistor structure. At step 3208, a carrier substrate (e.g., the carrier substrate 220 shown in FIG. 31) is attached to the front side (F) of the biosensor system package. At step 3210, the wafer is flipped. At step 3212, the bulk silicon layer of the substrate is removed. At step 3214, the buried oxide layer of the substrate is patterned to form an opening (e.g., the trench 222 shown in FIG. 31) at the backside (B) of the biosensor system package. At step 3216, an interface layer (e.g., the interface layer 224 shown in FIG. 31, which is a high-k material layer in one example) is deposited.

The method 3200 then proceeds to step 3218. At step 3218, the interface layer, the buried oxide layer, the semiconductor layer, and the top interposing dielectric layer (e.g., the top interposing dielectric layer 218 shown in FIG. 31) of the MLI structure are patterned and etched to form bonding trenches (e.g., bonding trenches 223 shown in FIG. 31) for exposing conductive lines at the first metal layer of the MLI structure and accommodating bond rings (e.g., the bond rings 256 shown in FIG. 31) and a pillar structure (e.g., the pillar structure 254 shown in FIG. 31).

The method 3200 then proceeds to step 3220 where a microfluidic channel cap structure is fabricated. In one embodiment, step 3220 includes steps 3252 to 3272 shown in FIG. 32C. At step 3252, a cap structure substrate is provided. At step 3254, an oxide layer is deposited on the cap structure substrate, and a nitride layer is deposited on the oxide layer. In the example in FIG. 33, the oxide layer 258 is deposited on the cap structure substrate 230, and the nitride layer 260 is deposited on the oxide layer 258. In one embodiment, the cap structure substrate 230 is a highly doped and conductive silicon substrate. In one embodiment, the thickness of the oxide layer 258 ranges from 100 nm to 300 nm, and the thickness of the nitride layer 260 ranges from 100 nm to 300 nm.

At step 3256, the oxide layer and the nitride layer are patterned and etched to define areas corresponding to the bonding rings, the pillar structure, and the chamber. In the example in FIG. 34, the oxide layer 258 and the nitride layer 260 are patterned and etched. The defined areas where the oxide layer 258 and the nitride layer 260 remain correspond to the pillar structure, the bonding rings, and the chamber, respectively.

At step 3258, isolation trenches are etched around the area corresponding to the pillar structure. In the example shown in FIG. 35, two isolation trenches 262 are formed around the area corresponding to the pillar structure by dry etch or wet etch. At step 3260, oxide is thermally grown in the isolation trenches. Thermal oxide does not grow in regions covered by the nitride layer. In one embodiment, the thickness of the thermal oxide is one order thicker than that of the oxide layer covered by the nitride. Moreover, thermal oxide grows on all sides of the cap structure substrate. In the example shown in FIG. 36, a (thermal) oxide layer 258 is grown in the isolation trenches 262.

At step 3262, the nitride layer and the oxide layer in defined areas are etched back. In the example shown in FIG. 37, the cap structure substrate 230 are exposed in defined areas. At step 3264, a polysilicon layer is blanket deposited. The polysilicon layer in defined areas corresponding to the pillar structure and bond rings later serves as a portion of the pillar structure and bond rings, respectively. In the example shown in FIG. 38, the polysilicon layer 264 is blanket deposited and over both the defined areas and undefined areas. In one embodiment, the thickness of the polysilicon layer 264 ranges from 3 µm to 5 µm.

At step 3266, native oxide of the polysilicon layer is removed and an intermediate layer is blanket deposited. The native oxide layer may form when a silicon-containing surface is exposed to ambient conditions or oxygen. The existence of the native oxide of the polysilicon can increase the resistance between the polysilicon and intermediate layer, which is undesirable. In one embodiment, the native oxide of the polysilicon layer is removed by wet processes such as treating the native oxide with dilute hydrofluoric acid (HF). The intermediate layer is made of any material suitable for eutectic bonding. In one embodiment, the intermediate layer is made of germanium (Ge). In the example in FIG. 39, the intermediate layer 266 is blanket deposited on the polysilicon layer 264 after removing the native oxide.

At step 3268, areas corresponding to the bond rings and the pillar structure are patterned, and the intermediate layer and the polysilicon layer in other unpatterned areas are moved. In the example in FIG. 40, the pillar structure 254 and the bond rings 256 are protruding after removing the intermediate layer 266 and the polysilicon layer 264 in other unpatterned areas. The pillar structure 254 and the bond rings 256 both include a portion of polysilicon layer 264 and a portion of intermediate layer 266 on top of the portion of the polysilicon layer 264. Optionally, the cap structure substrate 230 is etched in the area around the bond rings 256 and in the area corresponding to the chamber.

At step 3270, the global cavity region is patterned and etched to form the chamber. In the example in FIG. 41, the global cavity region 232 is patterned and the cap structure substrate 230 is etched in the global cavity region 232 to form the chamber 244. The chamber depth (CD) of the chamber 244 is smaller than the pillar structure depth (PD) of the pillar structure 254.

Optionally at step 3272, a high-k oxide material layer is deposited on the bottom surface and sidewalls of the chamber. Step 3272 is optional depending on applications. In one embodiment, step 3272 may be carried out by blanket depositing the high-k material layer and etching the high-k material layer while blocking the chamber area using a photoresist spray coater. In one embodiment, the thickness of the high-k oxide material ranges from 2 nm to 3 nm. In the example in FIG. 42, the high-k oxide material 242 covers the bottom surface and sidewalls of the chamber 244. As such, the microfluidic channel cap structure 228 is fabricated.

Figure 43:
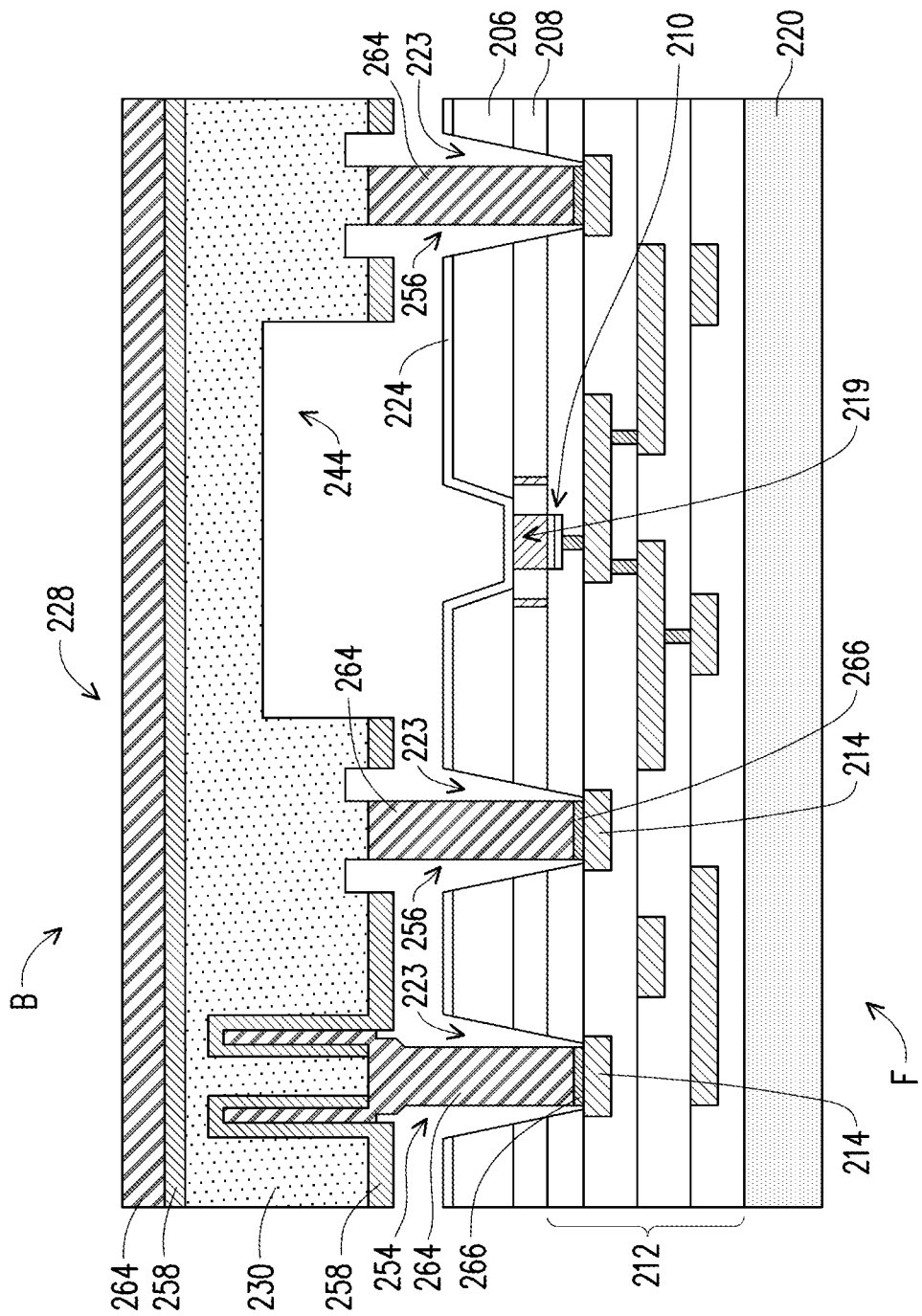
Figure 44:
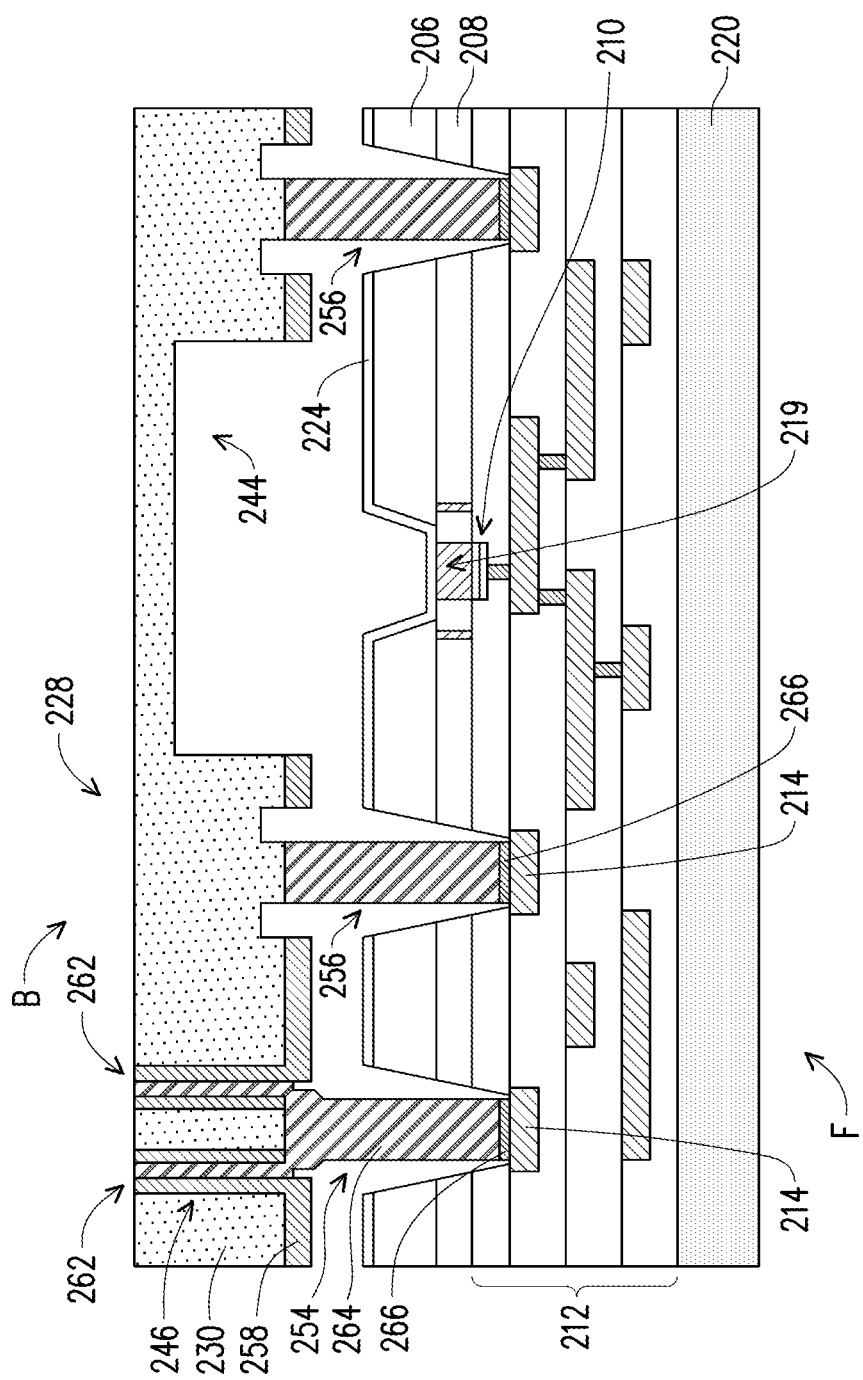
Figure 45:
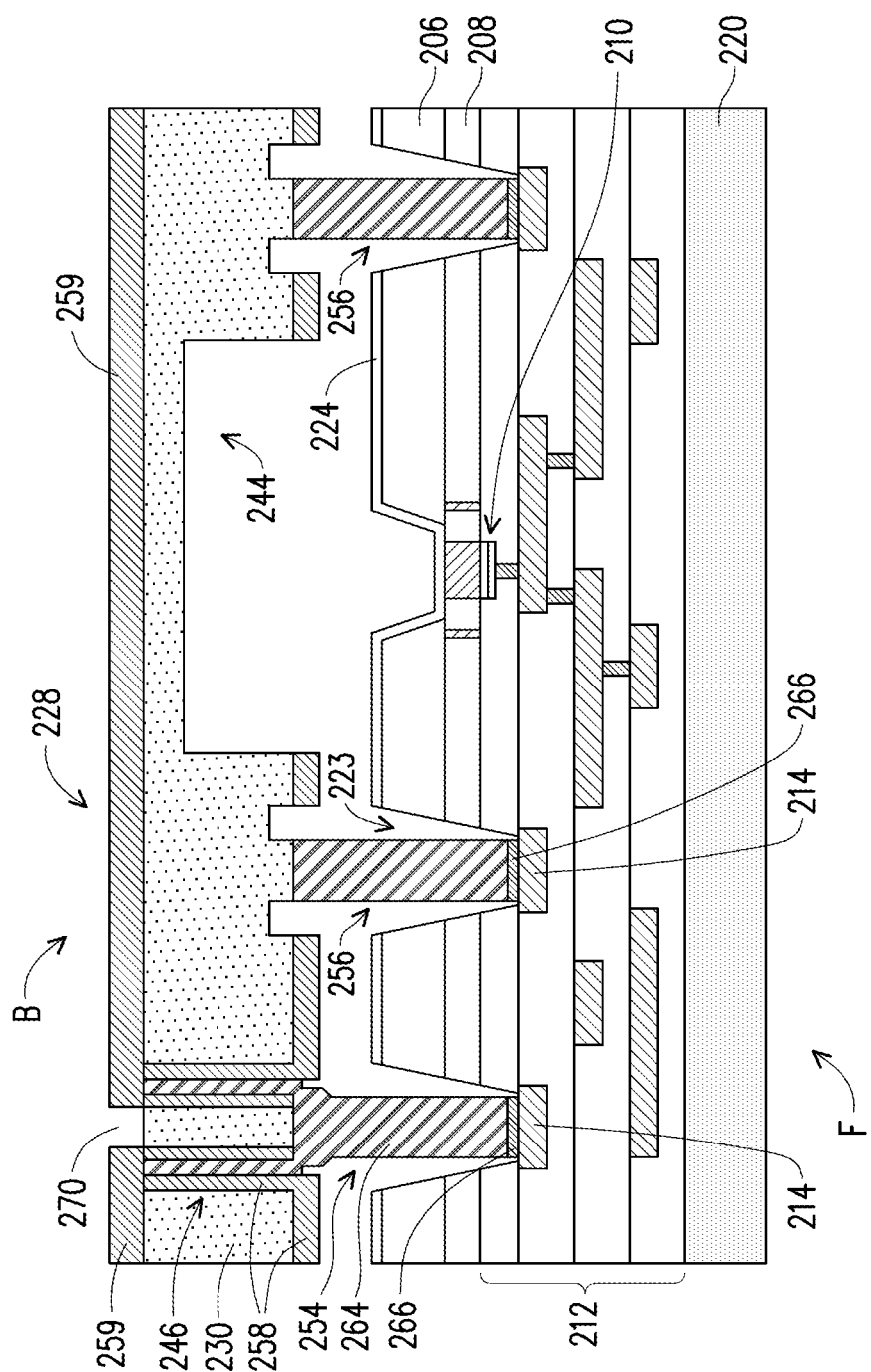
Figure 46:
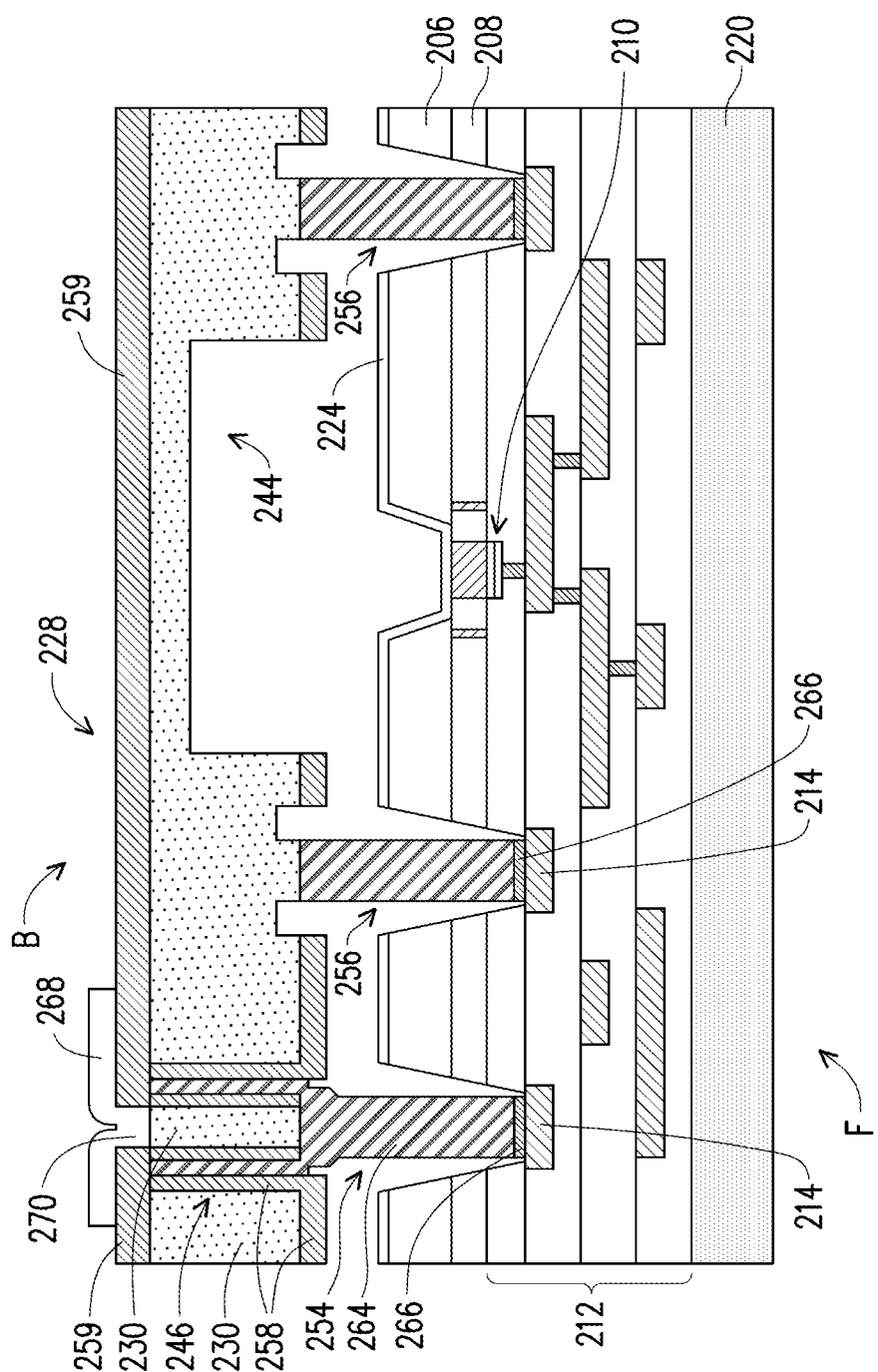
Figure 47:
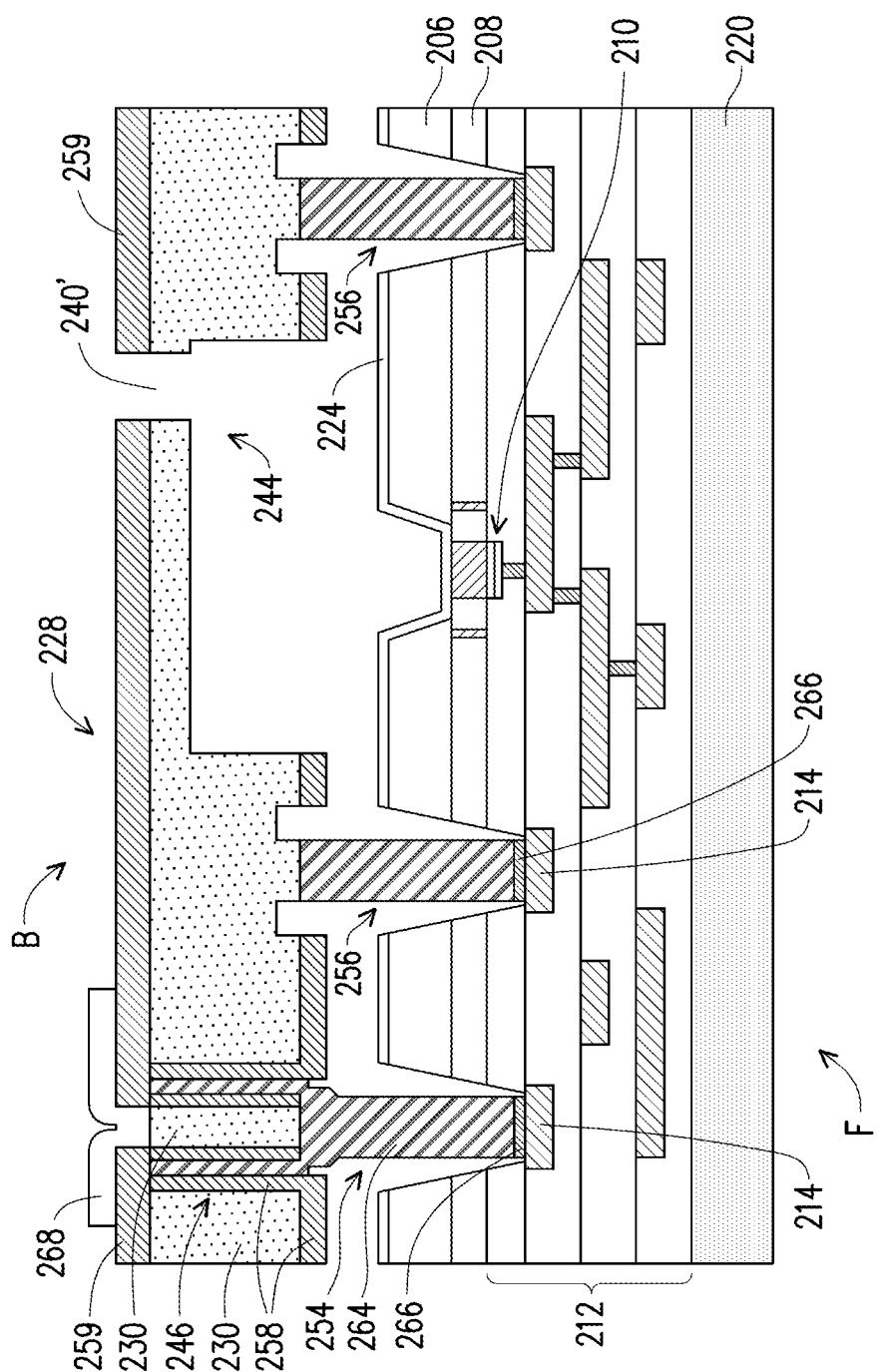

Referring back to FIGS. 32A and 32B, at step 3222, the microfluidic channel cap structure is bonded to the backside of the biosensor system package. In one embodiment, the bonding is using eutectic bonding, and the intermediate layers 266 at the top of the pillar structure and the bond rings are used to produce a eutectic system. In the example in FIG. 43, the microfluidic channel cap structure 228 is bonded to the back side (B) of the biosensor system package using eutectic bonding. Specifically, the pillar structure 254 and the bond rings 256 are accommodated in bonding trenches 223 and bonded to conductive line 214 at the first metal layer M1 of the MLI structure 212. It should be noted that FIG. 43 is not drawn to scale. In an non-limiting example, the depth of the bonding trench is 2 µm; the heights of the pillar structure 254 and the bond rings 256 are both 4 µm; the thickness of the carrier substrate 220 ranges from 300 µm to 750 µm; the thickness of the MLI structure 212 is 10 µm; the thickness of the cap structure substrate ranges from 500 µm to 750 µm.

At step 3224, the top part of the microfluidic channel cap structure is thinned. The microfluidic channel cap structure may be thinned by any suitable processes such as grinding and CMP. In the example in FIG. 44, after thinning the microfluidic channel cap structure 228, the TSV structure is exposed at the top of the back side (B).

At step 3226, a top oxide layer is patterned and deposited on the top part of the microfluidic channel cap structure to create a contact opening for the pillar structure. In the example in FIG. 45, the top oxide layer 259 is deposited over the entire top surface of the cap structure substrate 230 except a contact opening 270. As such, the TSV structure 246 is electrically insulated from other portions of the cap structure substrate 230.

At step 3228, a redistribution layer (RDL) is patterned and deposited over the contact opening. Generally, redistribution layers provide a conductive pattern that allows a pin-out contact pattern for a completed package different than the pattern of via structures, allowing for greater flexibility in the placement of vias and dies. Redistribution layers include conductive lines and via connections, where via connections connect an overlying line to an underlying conductive feature. In the example in FIG. 46, the redistribution layer 268 is patterned and deposited over the contact opening 270. The redistribution layer 268 is electrically connected to the highly doped cap structure substrate 230 in the TSV structure 246.

At step 3230, the top oxide layer and the cap structure substrate are patterned and etched to form inlet/outlet ports. Certain areas of the top oxide layer 259 and the cap structure substrate 230 are etched to form inlet/outlet port(s). As such, the inlet/outlet ports are formed. In the example in FIG. 47, the inlet/outlet port 240' is formed by etching the top oxide layer 259 and the cap structure substrate 230 in certain area within the chamber 244.

At step 3232, a separate chip is bonded to the redistribution layer. The separate chip may be any chips that function as a portion of the biosensor system. The separate chip may be bonded to the redistribution layer by any suitable processes. As shown in the example in FIG. 31, a RAM and data processing chip 250 is bonded to the redistribution layer 268 by solder bumps bonding (using a solder bump 248). Thus, the RAM and data processing chip 250 is connected to MLI structure by the following electrical path: the redistribution layer 268, the cap structure substrate 230 of the TSV structure 246, the pillar structure 254, and the conductive line 214 at the first metal layer. As such, the biosensor system package 3100 is fabricated using the method 3200.

Figure 48:
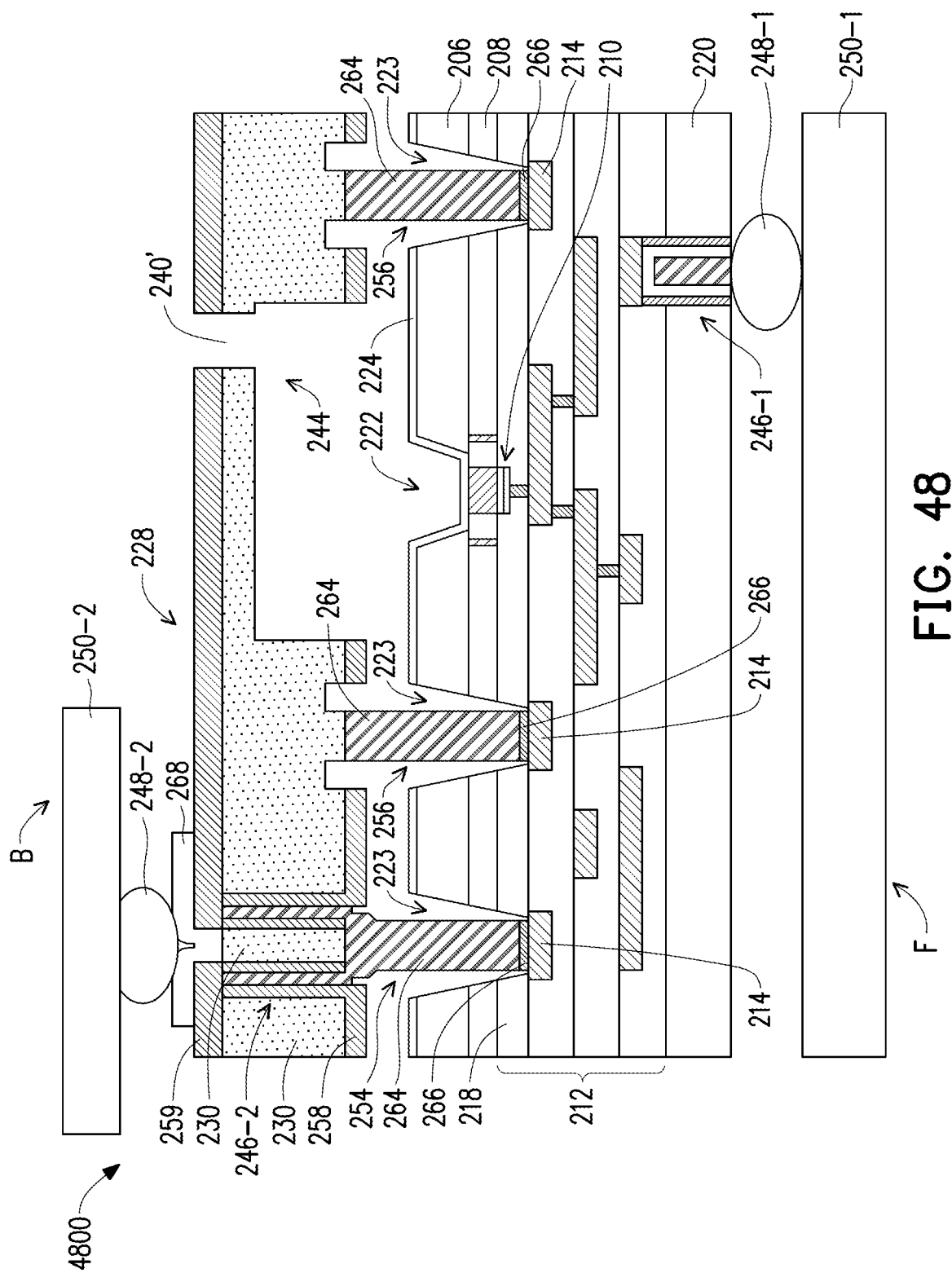
FIG. 48 is a cross-sectional diagram illustrating a biosensor system package in accordance with some embodiments.

FIG. 48 is a cross-sectional diagram illustrating a biosensor system package 4800 in accordance with some embodiments. The biosensor system package 4800 is a combination of the biosensor system package 200 in FIG. 2 and the biosensor system package 3100 in FIG. 31. Specifically, the biosensor system package 4800 is connected to one separate chip at the front side (using a first TSV structure through the carrier substrate) and another separate chip at the back side (using a second TSV structure through the cap structure substrate). In other words, a "three-chips-plus-microfluidic" structure is created. The fabrication method of the biosensor system package 4800 is a combination of the method 300 in FIGS. 3A-3B and the method 3200 in FIGS. 32A-32B, therefore not described in detail for simplicity.

As shown in FIG. 48, the biosensor system package 4800 has a front side (F) and a back side (B). In the example shown in FIG. 48, the biosensor system package 4800 includes, among other things, a buried oxide (BOX) layer 206, and a semiconductor layer 208, a transistor structure (i.e., a FET) 210, an MLI structure 212, a carrier substrate 220, a trench 222, three bonding trenches 223, an interface layer (e.g., a high-k material layer) 224, a microfluidic channel cap structure 228, a redistribution layer (RDL) 268, two solder bumps 248-1 and 248-2, and two separate chips (e.g., a RAM and data processing chip plus an auxiliary chip) 250-1 and 250-2. The microfluidic channel cap structure 228 is attached to the back side (B). The microfluidic channel cap structure 228 includes, among other things, a cap structure 230, a chamber 244, inlet/outlet ports 240', a second TSV structure 246-2, a pillar structure 254, two bond rings 256, an oxide layer 258, and a top oxide layer 259. The chamber 244 can hold fluid samples to be tested. The inlet/outlet ports 240' can be connected to pumps and/or reservoirs through tube(s). The first separate chip 250-1 is connected to the MLI structure 212 using the first TSV structure 246-1 through the carrier substrate 220. The second separate chip 250-2 is connected, through the second TSV structure 246-2 and the pillar structure 254, to at least one of the conductive lines at the first metal layer (e.g., conductive lines at the first metal layer "M1") 214 of the MLI structure 212. The microfluidic channel cap structure 228 is bonded to conductive lines 214 of the MLI structure 212 through the pillar structure 254 and the bond rings 256.

Embodiments in accordance with the disclosure include a biosensor system package. The biosensor system package includes: a transistor structure in a semiconductor layer having a front side and a back side, the transistor structure comprising a channel region; a multi-layer interconnect (MLI) structure on the front side of the semiconductor layer, the transistor structure being electrically connected to the MLI structure; a carrier substrate on the MLI structure; a first through substrate via (TSV) structure extending though the carrier substrate and configured to provide an electrical connection between the MLI structure and a separate die; a buried oxide (BOX) layer on the back side of the semiconductor layer, wherein the buried oxide layer has an opening on the back side of the channel region, and an interface layer covers the back side over the channel region; and a microfluidic channel cap structure attached to the buried oxide layer.

Further embodiments include a biosensor system package. The biosensor system package includes: a transistor structure in a semiconductor layer having a front side and a back side, the transistor structure comprising a channel region; a multi-layer interconnect (MLI) structure on the front side of the semiconductor layer comprising a first conductive line and a second conductive line at a first metal (M1) layer, the transistor structure being electrically connected to the MLI structure; a carrier substrate on the MLI structure; a buried oxide (BOX) layer on the back side of the semiconductor layer, wherein the buried oxide layer has an opening, a first bonding trench, and a second bonding trench on the back side of the channel region, and wherein an interface layer covers the back side over the channel region; a microfluidic channel cap structure attached to the first conductive line and the second conductive line; and a second through substrate via (TSV) structure extending through the microfluidic channel cap structure and configured to provide an electrical connection between the MLI structure and a separate die.

Further embodiments include a method of fabricating a biosensor system package. The method includes: providing a substrate, the substrate comprising a semiconductor layer having a front side and a back side, a buried oxide (BOX) layer at the back side, and a bulk silicon layer at the back side; forming a transistor structure on the substrate, wherein a channel region of the transistor structure is in the semiconductor layer; forming a multi-layer interconnect (MLI) structure on the front side of the semiconductor layer, wherein the MLI structure is electrically connected to the transistor structure; attaching a carrier substrate to the MLI structure; removing the bulk silicon layer; etching the buried oxide layer to form an opening at the back side over the channel region; depositing an interface layer on the back side over the channel region; fabricating a microfluidic channel cap structure; bonding the microfluidic channel cap structure to the BOX layer; thinning the carrier substrate; creating a first through substrate via (TSV) structure extending through the carrier substrate, the first TSV structure electrically connected to the MLI structure; and thinning the microfluidic channel cap structure to form at least one port for inflow and outflow of fluid samples.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A biosensor system package comprising:
    a transistor structure in a semiconductor layer having a front side and a back side, the transistor structure comprising a channel region;
    a multi-layer interconnect (MLI) structure on the front side of the semiconductor layer, the transistor structure being electrically connected to the MLI structure;
    a carrier substrate on the MLI structure;
    a first through substrate via (TSV) structure extending though the carrier substrate and configured to provide an electrical connection between the MLI structure and a first separate die;
    a buried oxide (BOX) layer on the back side of the semiconductor layer, wherein the buried oxide layer has an opening on the back side of the channel region, and an interface layer covers the back side over the channel region;
    a microfluidic channel cap structure attached to the buried oxide layer; and
    a second TSV structure extending through the microfluidic channel cap structure and configured to provide an electrical connection between the MLI structure and a second separate die.

2. The biosensor system package of claim 1, wherein the microfluidic channel cap structure is fabricated using a complementary metal-oxide-semiconductor (CMOS) compatible process flow.

3. The biosensor system package of claim 1, wherein the microfluidic channel cap structure further comprises:
a cap structure substrate having a chamber configured to accommodate fluid samples to be tested; and
at least one port connecting the chamber and for inflow and outflow of the fluid samples.

4. The biosensor system package of claim 3, wherein the microfluidic channel cap structure further comprises:
a high-k oxide material layer covering a bottom and sidewalls of the chamber.

5. The biosensor system package of claim 3, wherein the cap structure substrate has bonding areas interfacing with bonding sites of the buried oxide layer.

6. The biosensor system package of claim 1, wherein the MLI structure comprises:
a plurality of interposing dielectric layers;
a plurality of conductive lines, each conductive line disposed in one of the plurality of interposing dielectric layers; and
a plurality conductive vertical interconnect access (VIA) structures connecting the plurality of conductive lines.

7. The biosensor system package of claim 1, wherein the first TSV structure comprises:
a conductive material;
a liner isolating the conductive material from the carrier substrate; and
a diffusion barrier layer between the conductive material and the liner.

8. The biosensor system package of claim 1, further comprising:
the first separate die, wherein the first separate die is electrically connected to the first TSV structure and configured to process data collected by the transistor structure.

9. The biosensor system package of claim 1, wherein the interface layer is a high-k material layer.

10. The biosensor system package of claim 1, wherein the interface layer comprises a layer of capture reagent capable of binding a target analyte in the fluid samples.

11. A biosensor system package comprising:
a transistor structure in a semiconductor layer having a front side and a back side, the transistor structure comprising a channel region;
a multi-layer interconnect (MLI) structure on the front side of the semiconductor layer comprising a first conductive line and a second conductive line at a first metal (M1) layer, the transistor structure being electrically connected to the MLI structure;
a carrier substrate on the MLI structure;
a buried oxide (BOX) layer on the back side of the semiconductor layer, wherein the buried oxide layer has an opening, a first bonding trench, and a second bonding trench on the back side of the channel region, and wherein an interface layer covers the back side over the channel region;
a microfluidic channel cap structure attached to the first conductive line and the second conductive line; and
a second through substrate via (TSV) structure extending through the microfluidic channel cap structure and configured to provide an electrical connection between the MLI structure and a separate die.

12. The biosensor system package of claim 11, wherein the microfluidic channel cap structure is fabricated using a complementary metal-oxide-semiconductor (CMOS) compatible process flow.

13. The biosensor system package of claim 11, wherein the microfluidic channel cap structure further comprises:
a cap structure substrate having a chamber configured to accommodate fluid samples to be tested;
at least one port connecting the chamber and for inflow and outflow of the fluid samples;
a pillar structure accommodated in the first bonding trench and protruding toward the first conductive line, wherein the pillar structure is electrically connected to the second TSV structure; and
a bond ring accommodated in the second bonding trench and protruding toward the second conductive line.

14. The biosensor system package of claim 13, wherein the pillar structure and the bond ring both comprise a conductive layer and an intermediate layer, the intermediate layer used for eutectic bonding.

15. The biosensor system package of claim 14, wherein the conductive layer is made of polysilicon, and the intermediate layer is made of germanium.

16. The biosensor system package of claim 13, wherein the second TSV structure comprises:
a portion of the cap structure substrate, wherein the portion of the cap structure substrate is highly doped; and
at least one oxide layer surrounding the portion of the cap structure substrate.

17. The biosensor system package of claim 11, further comprising:
the separate die, wherein the separate die is electrically connected to the second TSV structure and configured to process data collected by the transistor structure.

18. The biosensor system package of claim 11, wherein the interface layer is a high-k material layer.

19. A biosensor system package comprising:
a transistor structure in a semiconductor layer having a front side and a back side, the transistor structure comprising a channel region;
a multi-layer interconnect (MLI) structure on the front side of the semiconductor layer comprising a first conductive line and a second conductive line at a first metal (M1) layer, the transistor structure being electrically connected to the MLI structure;
a carrier substrate on the MLI structure;
a first through substrate via (TSV) structure extending though the carrier substrate and configured to provide an electrical connection between the MLI structure and a first separate die;
a buried oxide (BOX) layer on the back side of the semiconductor layer, wherein the buried oxide layer has a first bonding trench and a second bonding trench on the back side of the channel region, and wherein an interface layer covers the back side over the channel region;
a microfluidic channel cap structure attached to the first conductive line and the second conductive line; and
a second through substrate via (TSV) structure extending through the microfluidic channel cap structure and configured to provide an electrical connection between the MLI structure and a second separate die.

20. The biosensor system package of claim 19, wherein the microfluidic channel cap structure further comprises:
a cap structure substrate having a chamber configured to accommodate fluid samples to be tested;

at least one port connecting the chamber and for inflow and outflow of the fluid samples;
a pillar structure accommodated in the first bonding trench and protruding toward the first conductive line, wherein the pillar structure is electrically connected to the second TSV structure; and
a bond ring accommodated in the second bonding trench and protruding toward the second conductive line.

* * * * *